(12) United States Patent
Takenaga

(10) Patent No.: US 12,507,509 B2
(45) Date of Patent: Dec. 23, 2025

(54) LIGHT-EMITTING ELEMENT AND LIGHT-EMITTING DEVICE

(71) Applicant: NICHIA CORPORATION, Anan (JP)

(72) Inventor: Koichi Takenaga, Tokushima (JP)

(73) Assignee: Nichia Corporation, Anan (JP)

( * ) Notice: Subject to any disclaimer, the term of this patent is extended or adjusted under 35 U.S.C. 154(b) by 448 days.

(21) Appl. No.: 18/064,599

(22) Filed: Dec. 12, 2022

(65) Prior Publication Data

US 2023/0207763 A1 Jun. 29, 2023

(30) Foreign Application Priority Data

Dec. 24, 2021 (JP) .................. 2021-210673

(51) Int. Cl.
*H10H 20/831* (2025.01)
*H10H 20/857* (2025.01)

(52) U.S. Cl.
CPC ...... *H10H 20/8312* (2025.01); *H10H 20/831* (2025.01); *H10H 20/857* (2025.01)

(58) Field of Classification Search
CPC . H10H 20/831; H10H 20/8312; H10H 20/857
See application file for complete search history.

(56) References Cited

U.S. PATENT DOCUMENTS 11,594,658 B2 * 2/2023 Tsai ............... H10H 20/814
11,799,059 B2 * 10/2023 Kondo ............ H10H 20/8312
2018/0182929 A1 6/2018 Ozeki et al.
2019/0097086 A1 3/2019 Shichijo et al.
2019/0267529 A1 8/2019 Nakai et al.
2019/0296192 A1 9/2019 Fukui et al.
2020/0044128 A1 2/2020 Miki et al.
2020/0212278 A1 7/2020 Takenaga et al.
2020/0243721 A1 * 7/2020 Yoon ............... H10H 20/857
2021/0336109 A1 10/2021 Kageyama
2022/0102587 A1 * 3/2022 Kageyama ....... H10H 20/8312

FOREIGN PATENT DOCUMENTS

JP 2013-239471 A 11/2013
JP 2016-032009 A 3/2016
JP 2018-107371 A 7/2018

(Continued)

*Primary Examiner* — Yu Chen
(74) *Attorney, Agent, or Firm* — Kim & Stewart LLP

(57) ABSTRACT

A light-emitting element includes a semiconductor structure including a first semiconductor layer, an active layer, and a second semiconductor layer, an insulating film, a first electrode, a second electrode, a plurality of first conductive members, and a plurality of second conductive members. A plurality of first regions at an upper surface of the first semiconductor layer are aligned in a first direction. A first electrode region of the first electrode includes a plurality of first portions covering the plurality of first regions and a second portion positioned between the first portions adjacent to each other. The first portion includes a plurality of first extending portions extending in a direction toward the second electrode with respect to the second portion. The second electrode includes a plurality of first recessed portions corresponding to the plurality of the first extending portions, respectively.

10 Claims, 15 Drawing Sheets

(56) References Cited

FOREIGN PATENT DOCUMENTS

| | | | |
|---|---|---|---|
| JP | 2019-062172 | A | 4/2019 |
| JP | 2019-153777 | A | 9/2019 |
| JP | 2019-175887 | A | 10/2019 |
| JP | 2020-021785 | A | 2/2020 |
| JP | 2020-043375 | A | 3/2020 |
| JP | 2020-098852 | A | 6/2020 |
| JP | 2020-107819 | A | 7/2020 |
| JP | 2020-178017 | A | 10/2020 |
| JP | 2021-097170 | A | 6/2021 |
| JP | 2021-176189 | A | 11/2021 |
| JP | 2021-185629 | A | 12/2021 |

* cited by examiner

LIGHT-EMITTING ELEMENT AND LIGHT-EMITTING DEVICE

CROSS-REFERENCE TO RELATED APPLICATIONS

This application is based upon and claims the benefit of priority from Japanese Patent Application No. 2021-210673, filed Dec. 24, 2021, the entire contents of which are incorporated herein by reference.

FIELD

Embodiments relate to a light-emitting element and a light-emitting device.

BACKGROUND

Japanese Patent Publication No. 2013-239471 discloses a light-emitting device in which a first electrode and a second electrode of a light-emitting element are each electrically connected to a wiring line of a substrate through a bump.

SUMMARY

An object of one or more embodiments is to provide a light-emitting element that is easy to mount while reducing brightness unevenness and provide a light-emitting device including such a light-emitting element.

A light-emitting element according to an embodiment includes a semiconductor structure including a first semiconductor layer of a first conductive type including, on an upper surface of the first semiconductor layer, a plurality of first regions and a second region surrounding each of the plurality of first regions, an active layer disposed selectively on the second region of the first semiconductor layer, and a second semiconductor layer of a second conductive type disposed on the active layer, an insulating film disposed on the semiconductor structure and including a plurality of first openings above the plurality of first regions, respectively, and a second opening above a region of the second semiconductor layer, a first electrode disposed on the insulating film and electrically connected to the plurality of first regions through the plurality of first openings, a second electrode disposed above the region of the second semiconductor layer, spaced apart from the first electrode, and electrically connected to the second semiconductor layer through the second opening, a plurality of first conductive members disposed on the first electrode, and a plurality of second conductive members disposed on the second electrode. The plurality of first regions are aligned in a first direction on the upper surface of the first semiconductor layer. The first electrode includes a first electrode region covering the plurality of first regions disposed adjacent to the second electrode in a second direction perpendicular to the first direction. The first electrode region includes a plurality of first portions covering the plurality of first regions, respectively, and a second portion positioned between two adjacent first portions of the plurality of first portions. The plurality of first portions includes a plurality of first extending portions extending in the second direction toward the second electrode with respect to the second portion. The second electrode includes a plurality of first recessed portions corresponding to the plurality of the first extending portions, respectively. The plurality of second conductive members are aligned in the first direction and include a plurality of first end portions, respectively. Each of the first end portions is closest to the first electrode region in the second direction. The plurality of the first extending portions are positioned closer to the second portion in the second direction than a first straight line that extends in the first direction and passes through one of the first end portions that is closest to the first electrode region.

A light-emitting device according to an embodiment includes the light-emitting element described above, and a substrate including a first wiring line electrically connected to the plurality of first conductive members, and a second wiring line spaced apart from the first wiring line and electrically connected to the plurality of second conductive members.

According to an embodiment, it is possible to provide a light-emitting element that is easy to mount while reducing brightness unevenness, and a light-emitting device including such a light-emitting element.

DESCRIPTION OF EMBODIMENTS

Each embodiment will be described below with reference to the drawings. It is noted that the drawings are schematic or conceptual, and the relationships between thicknesses and widths of portions, the proportions of sizes between portions, and the like are not necessarily the same as the actual values thereof. Furthermore, the dimensions and the proportions may be illustrated differently among the drawings, even in a case in which the same portion is illustrated. In addition, in the present description and each of the drawings, the same reference signs are used to refer to elements similar to those that have been described with reference to the provided drawings, and detailed explanation will not be repeated as appropriate.

Furthermore, in the following, an XYZ Cartesian coordinate system is used to explain the arrangement of and the configuration of each component, for the purpose of facilitating understanding. The X axis, the Y axis, and the Z axis are perpendicular to each other. In addition, a direction in which the X axis extends is referred to as an "X direction", a direction in which the Y axis extends is referred to as a "Y direction", and a direction in which the Z axis extends is referred to as a "Z direction". Furthermore, in some cases, the Z direction is the upward direction, and the opposite direction is the downward direction, for the purpose of facilitating understanding. However, these directions are irrelevant to the gravity direction. In addition, the "top view" may be referred to a view of a target member from above or a view of a target member in a transparent manner as appropriate. Furthermore, of the X direction, the arrowed direction is referred to as a "+X direction", and the opposite direction is referred to as a "−X direction". In addition, of the Y direction, the arrowed direction is referred to as a "+Y direction", and the opposite direction is referred to as a "−Y direction".

First Embodiment

Figure 1:
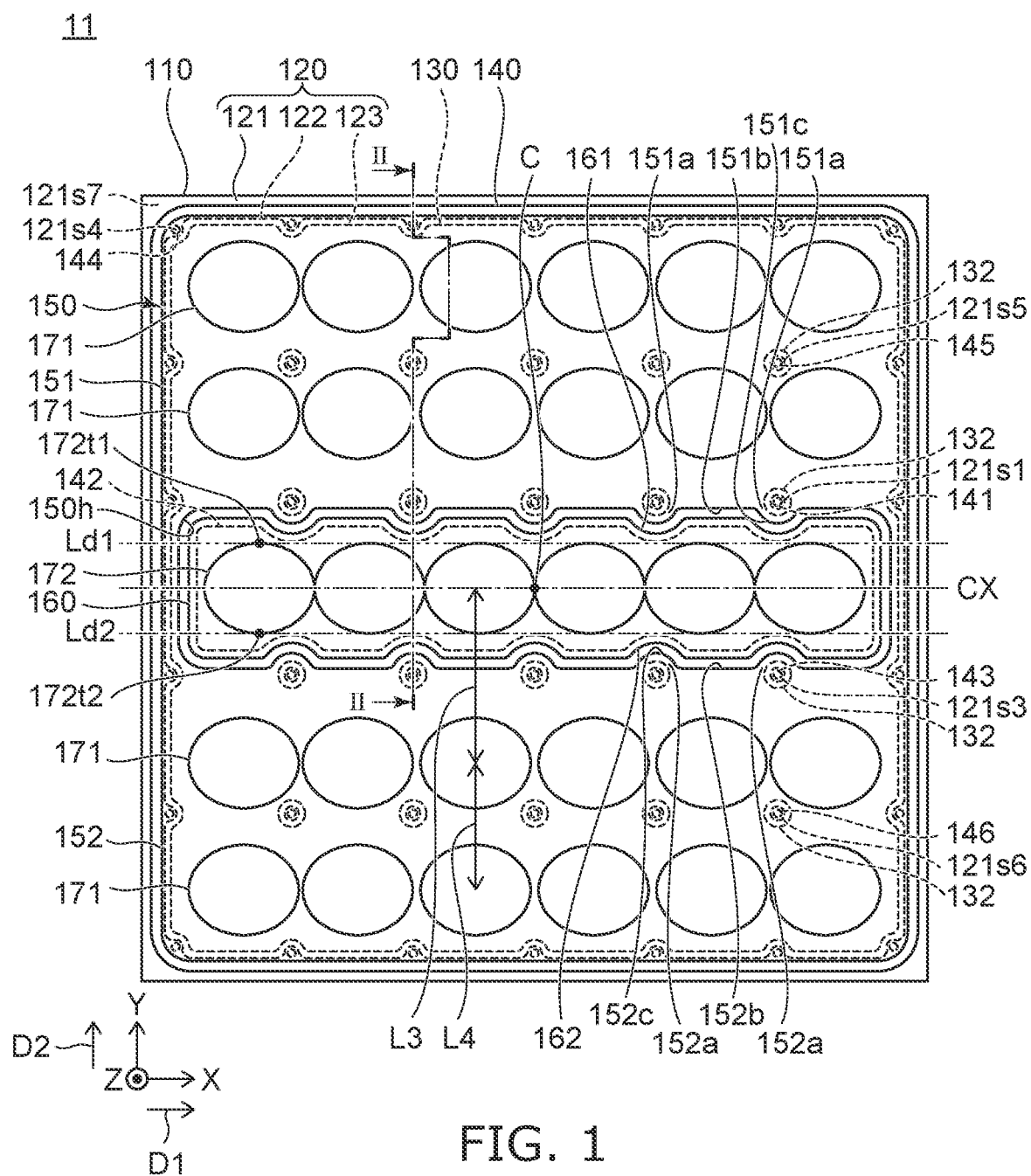
FIG. 1 illustrates a top view of a light-emitting element according to a first embodiment.

FIG. 1 illustrates a top view of a light-emitting element 11 according to a first embodiment.

Figure 2:
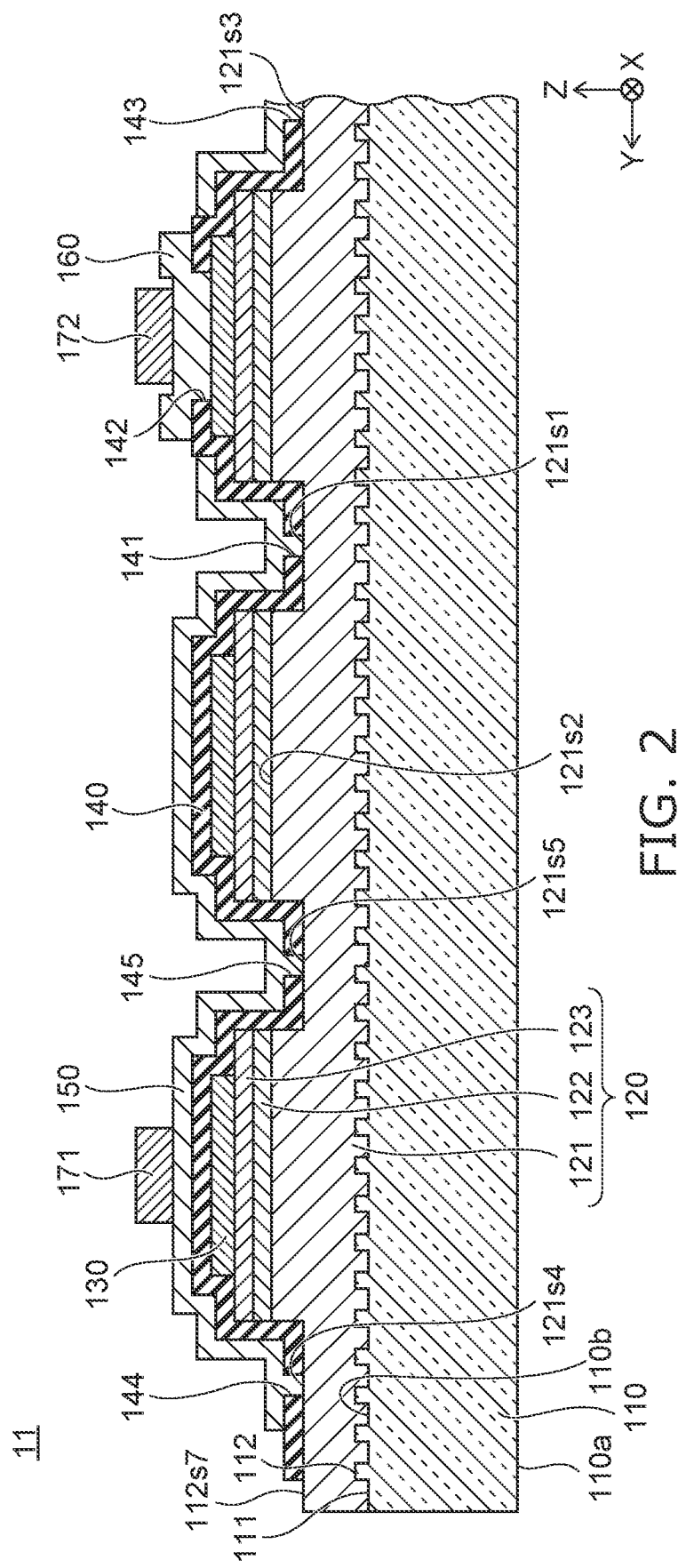
FIG. 2 illustrates a cross-sectional view of the light-emitting element taken along line II-II in FIG. 1.

FIG. 2 schematically illustrates a cross-sectional view of the light-emitting element 11 taken along line II-II in FIG. 1.

The light-emitting element 11 according to the present embodiment includes a support substrate 110, a semiconductor structure 120, an insulating film 140, a first electrode 150, a second electrode 160, a plurality of first conductive members 171, and a plurality of second conductive members 172, as illustrated in FIGS. 1 and 2. The light-emitting element 11 further includes a third electrode 130. In the following, each component of the light-emitting element 11 will be described in detail.

The support substrate 110 is a member that supports the semiconductor structure 120. In addition, the support substrate 110 is a member used to perform epitaxial growth of the semiconductor structure 120. Furthermore, it is preferable that the support substrate 110 is a member having transmissivity for light from the semiconductor structure 120, and includes, for example, sapphire. However, the material of the support substrate 110 is not limited to that described above. For example, as the material of the support substrate 110, it may be possible to use spinel ($MgAl_2O_4$), silicon carbide (SiC), silicon (Si), zinc sulfide (ZnS), zinc oxide (ZnO), gallium arsenide (GaAs), diamond, lithium niobate, neodymium gallate, or the like.

Surfaces of the support substrate 110 include a lower surface 110a and an upper surface 110b opposite to the lower surface 110a. As illustrated in FIG. 2, the Z direction is a direction from the lower surface 110a of the support substrate 110 toward the upper surface 110b. The lower surface 110a is substantially parallel to the XY plane. The upper surface 110b includes a surface region 111 substantially parallel to the XY plane and a plurality of protruding portions 112 protruding from the surface region 111 in the +Z direction. However, the shapes of the upper surface 110a and the lower surface 110b of the support substrate 110 are not limited to those described above. For example, the upper surface 110a of the support substrate 110 may only include a surface region substantially parallel to the XY plane.

As illustrated in FIG. 1, the top view shape of the support substrate 110 is, for example, rectangular. In the top view, of four sides that constitute the outer edge of the support substrate 110, two sides extend substantially in the X direction, and the remaining two sides extend substantially in the Y direction. However, the top view shape of the support substrate is not limited to that described above and may be polygonal such as hexagonal, for example.

As illustrated in FIG. 2, the semiconductor structure 120 is disposed on the upper surface 110b of the support substrate 110. For example, a nitride semiconductor may be used for the semiconductor structure 120. Here, the "nitride semiconductor" represents a semiconductor containing nitrogen and is typically a semiconductor containing all compositions of a chemical formula of $In_xAl_yGa_{1-x-y}N$ ($0 \le x \le 1$, $0 \le y \le 1$, $x+y \le 1$) in which the composition ratios x and y are changed within the respective ranges.

The semiconductor structure 120 includes a first semiconductor layer 121 of a first conductive type disposed on the support substrate 110, an active layer 122 disposed on the first semiconductor layer 121, and a second semiconductor layer 123 of a second conductive type disposed on the active layer 122.

Figure 3:
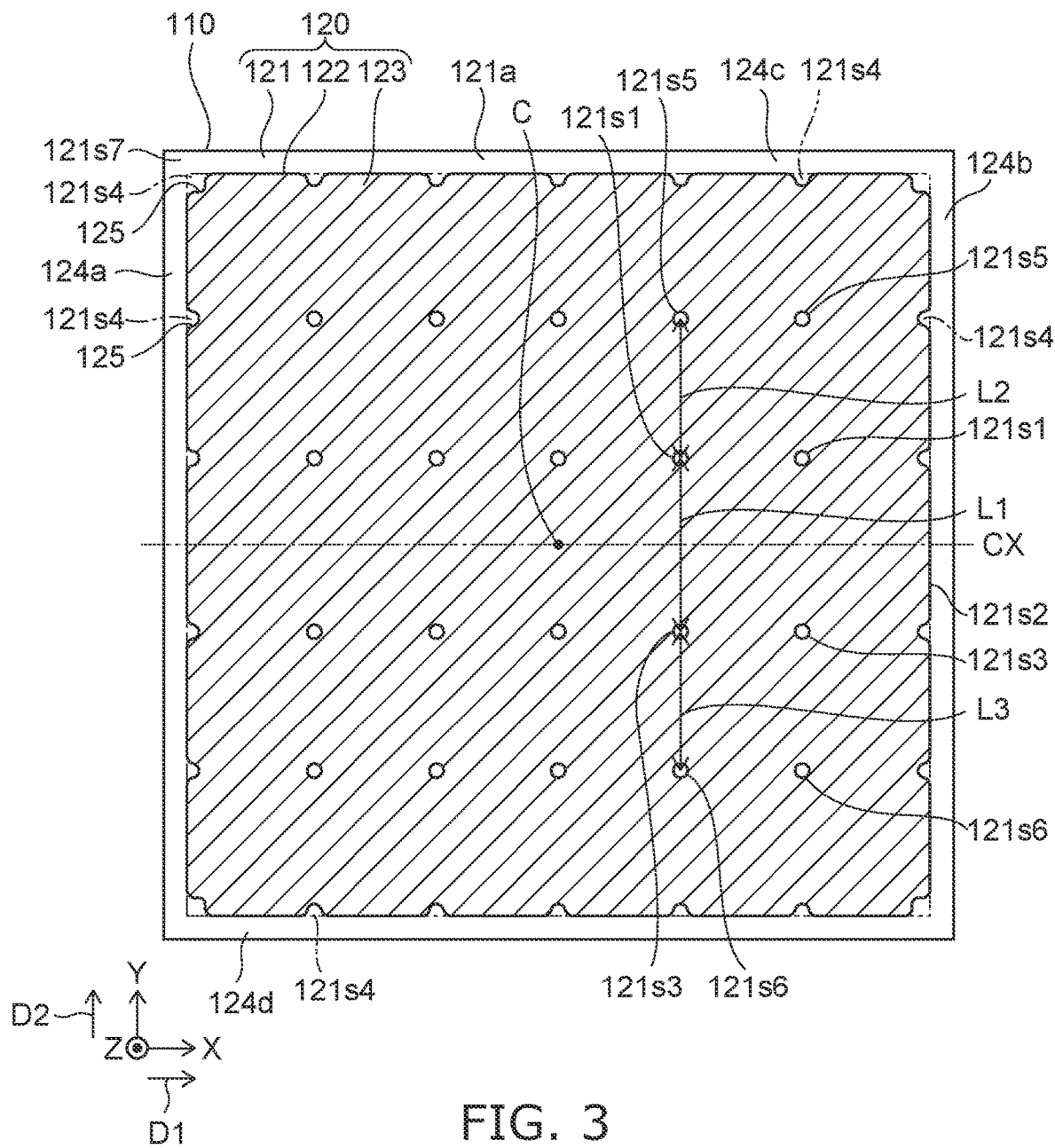
FIG. 3 illustrates a top view of some components of the light-emitting element according to the first embodiment.

FIG. 3 illustrates a top view of the support substrate 110 and the semiconductor structure 120 of the light-emitting element 11 according to the present embodiment. It is noted that, in FIG. 3, hatching is applied to the region where the active layer 122 and the second semiconductor layer 123 are disposed in the top view, for the purpose of facilitating understanding.

The first semiconductor layer 121 includes, for example, an n-type semiconductor layer. The first semiconductor layer 121 covers substantially the entire region of the upper surface 110a of the support substrate 110. Thus, in the present embodiment, the top view shape of the first semiconductor layer 121 is substantially the same as the top view shape of the support substrate 110. Alternatively, an outer peripheral region of the upper surface 110a of the support substrate 110 may not be covered with the first semiconductor layer 121.

The active layer 122 is positioned on the first semiconductor layer 121. The active layer 122 partially covers the upper surface of the first semiconductor layer 121.

The second semiconductor layer 123 includes, for example, a p-type semiconductor layer. The second semiconductor layer 123 is positioned on the active layer 122. In the present embodiment, the second semiconductor layer 123 covers substantially the entire region of the upper surface of the active layer 122. Thus, the top view shape of the second semiconductor layer 123 is substantially the same as the top view shape of the active layer 122.

An upper surface 121a of the first semiconductor layer 121 includes a plurality of first regions 121s1, a second region 121s2, a plurality of third regions 121s3, a plurality of fourth regions 121s4, a plurality of fifth regions 121s5, a plurality of sixth regions 121s6, and an outer peripheral region 121s7. Of the upper surface 121a, the second region 121s2 is a region that is covered by the active layer 122 and the second semiconductor layer 123. The plurality of first regions 121s1, the plurality of third regions 121s3, the plurality of fifth regions 121s5, and the plurality of sixth regions 121s6 are regions positioned inside the outer edge of the second region 121s2 of the upper surface 121a and are not covered with the active layer 122 and the second semiconductor layer 123. The plurality of fourth regions 121s4 and the outer peripheral region 121s7 are regions positioned outside the second region 121s2 of the upper surface 121a and are not covered with the active layer 122 and the second semiconductor layer 123.

For example, in the top view of FIG. 3, the shape of each of the first regions 121s1, the shape of each of the third regions 121s3, the shape of each of the fifth regions 121s5, and the shape of each of the sixth regions 121s6 are substantially the same, each of which is substantially circular. Alternatively, the top view shapes of the first region, the third region, the fifth region, and the sixth region may differ from each other. In addition, the top view shapes of the first region, the third region, the fifth region, and the sixth region may be other shapes such as elliptical, polygonal, or polygonal having rounded corner portions.

In the top view, the plurality of first regions 121s1 are positioned on the +Y side of a straight line CX passing through the center C of the semiconductor structure 120 and aligned in the X direction. The plurality of first regions 121s1 are lined up at substantially equal intervals in a first direction D1 along the XY plane. Hereinafter, a direction perpendicular to the first direction D1 in the top view is referred to as a second direction D2. In the present embodiment, the first direction D1 matches the X direction and the second direction D2 matches the Y direction. However, in an alternative embodiment, the first direction may differ from the X direction. In addition, the second direction may differ from the Y direction. In the example illustrated in FIG. 3, the number of first regions 121s1 is five.

In the top view, the plurality of third regions 121s3 are positioned on the −Y side of the straight line CX. The plurality of third regions 121s3 are lined up at substantially equal intervals in the first direction D1. In the example illustrated in FIG. 3, the number of the third regions 121s3 is five. The plurality of third regions 121s3 are disposed so as to be substantially symmetrical with the plurality of first regions 121s1 with the straight line CX being the reference.

In the top view, the plurality of fifth regions 121s5 are positioned on the +Y side of the plurality of first regions 121s1. The plurality of fifth regions 121s5 are lined up at substantially equal intervals in the first direction D1. The plurality of fifth regions 121s5 may be disposed so as to form a plurality of columns. In the example illustrated in FIG. 3, the number of the fifth regions 121s5 is five. In addition, the fifth regions 121s5 are disposed so as to be aligned with the first regions 121s1 in the second direction D2, respectively.

In the top view, the plurality of sixth regions 121s6 are positioned on the −Y side of the plurality of third regions 121s3. The plurality of sixth regions 121s6 are lined up at substantially equal intervals in the first direction D1. The plurality of sixth regions 121s6 may be disposed so as to form a plurality of columns. In the example illustrated in FIG. 3, the number of the sixth regions 121s6 is five. In addition, the sixth regions 121s6 are disposed so as to be aligned with the third regions 121s3 in the second direction D2, respectively. The plurality of sixth regions 121s6 are disposed so as to be substantially symmetrical with the plurality of fifth regions 121s5 with the straight line CX being the reference.

Thus, in the example illustrated in FIG. 3, one sixth region 121s6, one third region 121s3, one first region 121s1, and one fifth region 121s5 are lined up in this order in the +Y direction. In addition, five columns each containing such a plurality of regions are aligned in the X direction. A distance L1 between the center of the first region 121s1 and the center of the third region 121s3 that are adjacent to each other in the Y direction is greater than a distance L2 between the center of the first region 121s1 and the center of the fifth region 121s5 that are adjacent to each other in the Y direction. The distance L1 is greater than a distance L3 between the center of the third region 121s3 and the center of the sixth region 121s6 that are adjacent to each other in the Y direction. However, the number of and the position of each of the first regions, the third regions, the fifth regions, and the sixth regions are not limited to those described above, and the distance between these regions is not limited to those described above.

The outer peripheral region 121s7 is a region having a frame shape and including the outer edge of the upper surface 121a. The shape of the outer edge of the outer peripheral region 121s7 is substantially rectangular like the shape of the outer edge of the upper surface 121a. The shape of the inner peripheral edge of the outer peripheral region 121s7 is similar, for example, to the shape of the outer edge of the upper surface 121a and is substantially rectangular. Specifically, the outer peripheral region 121s7 includes a first stretching portion 124a extending in the Y direction and positioned on the most −X side, a second stretching portion 124b extending in the Y direction and positioned on the most +X side, a third stretching portion 124c extending in the X direction and positioned on the most +Y side, and a fourth stretching portion 124d extending in the X direction and positioned on the most −Y side. The third stretching portion 124c is positioned between an end portion, in the +Y direction, of the first stretching portion 124a and an end portion, in the +Y direction, of the second stretching portion 124b. An end portion, in the −X direction, of the third stretching portion 124c is connected to the end portion, in the +Y direction, of the first stretching portion 124a. An end portion, in the +X direction, of the third stretching portion 124c is connected to the end portion, in the +Y direction, of the second stretching portion 124b. The fourth stretching portion 124d is positioned between an end portion, in the −Y direction, of the first stretching portion 124a and an end portion, in the −Y direction, of the second stretching portion 124b. An end portion, in the −X direction, of the fourth stretching portion 124d is connected to the end portion, in the −Y direction, of the first stretching portion 124a. An end portion, in the +X direction, of the fourth stretching portion 124d is connected to the end portion, in the −Y direction, of the second stretching portion 124b.

The fourth regions 121s4 are regions extending inward from the outer peripheral region 121s7. It is noted that, in FIG. 3, the boundary between the outer peripheral region 121s7 and each of the fourth regions 121s4 is illustrated by the dash-dot-dot-dash line. Specifically, on the −X side of the second region 121s2, four fourth regions 121s4 extend in the +X direction from the corresponding positions, in the Y direction, of the first stretching portion 124a. In addition, on the +X side of the second region 121s2, four fourth regions 121s4 extend in the −X direction from the corresponding positions, in the Y direction, of the second stretching portion 124b. Furthermore, on the +Y side of the second region 121s2, five fourth regions 121s4 extend in the −Y direction from the corresponding positions, in the X direction, of the third stretching portion 124c. In addition, on the −Y side of the second region 121s2, five fourth regions 121s4 extend in the +Y direction from the corresponding positions, in the X direction, of the fourth stretching portion 124d. Furthermore, four fourth regions 121s4 extend from the corresponding four corner portions of the outer peripheral region 121s7 in a diagonal direction intersecting the X direction and the Y direction.

Each of the fourth regions 121s4 extending from the first stretching portion 124a and each of the fourth regions 121s4 extending from the second stretching portion 124b are lined up in the X direction with one of the plurality of first regions 121s1, the plurality of third regions 121s3, the plurality of fifth regions 121s5, and the plurality of sixth regions 121s6. In addition, each of the fourth regions 121s4 extending from the third stretching portion 124c and each of the fourth regions 121s4 extending from the fourth stretching portion 124d are disposed so as to be lined up in the Y direction with one of the plurality of fifth regions 121s5, one of the plurality of first regions 121s1, one of the plurality of third regions 121s3, and one of the plurality of sixth regions 121s6.

In the top view, the second region 121s2 surrounds each of the first regions 121s1, each of the third regions 121s3, each of the fifth regions 121s5, and each of the sixth regions 121s6. The outer peripheral portion of the second region 121s2 includes a plurality of recessed portions 125 corresponding to the plurality of fourth regions 121s4.

The plurality of first regions 121s1, the plurality of third regions 121s3, the plurality of fourth regions 121s4, the plurality of fifth regions 121s5, the plurality of sixth regions 121s6, and the outer peripheral region 121s7 are positioned lower than the second region 121s2, as illustrated in FIG. 2. For example, the plurality of first regions 121s1, the plurality of third regions 121s3, the plurality of fourth regions 121s4, the plurality of fifth regions 121s5, the plurality of sixth regions 121s6, and the outer peripheral region 121s7 are formed by forming the active layer 122 and the second semiconductor layer 123 over substantially the entire region of the upper surface of the first semiconductor layer 121, and then, removing a part of the first semiconductor layer 121, a part of the active layer 122, and a part of the second semiconductor layer 123. However, in the first semiconductor layer, the number of and the position of the exposed regions from the active layer and the second semiconductor layer are not limited to those described above.

Figure 4:
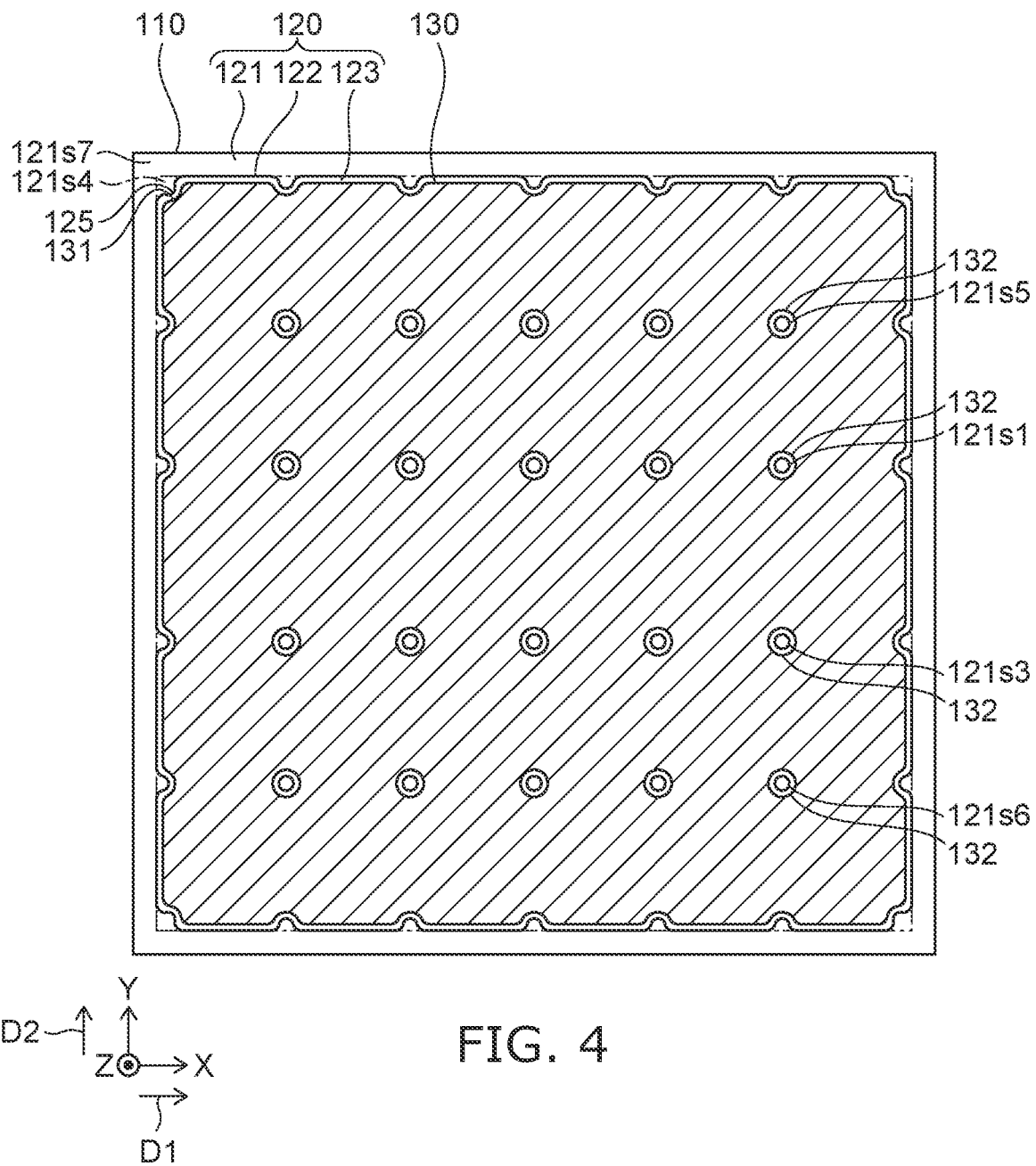
FIG. 4 illustrates a top view of other some components of the light-emitting element according to the first embodiment.

FIG. 4 illustrates a top view of the support substrate 110, the semiconductor structure 120, and the third electrode 130 of the light-emitting element 11 according to the present embodiment.

It is noted that, in FIG. 4, hatching is applied to the region where the third electrode 130 is disposed, for the purpose of facilitating understanding.

The third electrode 130 is disposed on the second semiconductor layer 123.

The third electrode 130 is made of a conductive material such as metal. It is preferable that the third electrode 130 is a light reflective electrode having high light reflectivity with respect to light emitted from the active layer 122. The metal used for the third electrode 130 includes, for example, aluminum (Al), titanium (Ti), ruthenium (Ru), or the like. The third electrode 130 may be made of a layer of one of these metals, may have a structure in which layers of these metals are stacked, or may be made of an alloy containing these metals.

The third electrode 130 is in contact with the second semiconductor layer 123 and thus electrically connected to the second semiconductor layer 123. In the top view, the area of the third electrode 130 is less than, for example, the area of the second semiconductor layer 123, and the third electrode 130 is positioned inside the outer edge of the second semiconductor layer 123. The top view shape of the outer edge of the third electrode 130 is substantially similar to the top view shape of the outer edge of the second semiconductor layer 123. That is, the outer edge of the third electrode 130 includes a plurality of recessed portions 131 corresponding to the plurality of recessed portions 125. Alternatively, the third electrode 130 may cover substantially the entire region of the upper surface of the second semiconductor layer 123.

The third electrode 130 includes a plurality of openings 132 where the plurality of first regions 121s1, the plurality of third regions 121s3, the plurality of fifth regions 121s5, and the plurality of sixth regions 121s6 are exposed. In the top view, the area of each of the openings 132 is greater than the area of the corresponding one of regions 121s1, 121s3, 121s5, 121s6. In the top view, a portion of the second semiconductor layer 123 that are positioned around each of the first regions 121s1, each of the third regions 121s3, each of the fifth regions 121s5, and each of the sixth regions 121s6 are exposed in each of the openings 132. The top view shape of each of the openings 132 is substantially similar to the top view shape of the corresponding one of regions 121s1, 121s3, 121s5, 121s6 of the first semiconductor layer 121. In an alternative embodiment, the top view shape of each of the openings 132 of the third electrode 130 may not be similar to the top view shape of the corresponding one of regions of the first semiconductor layer 121.

Figure 5:
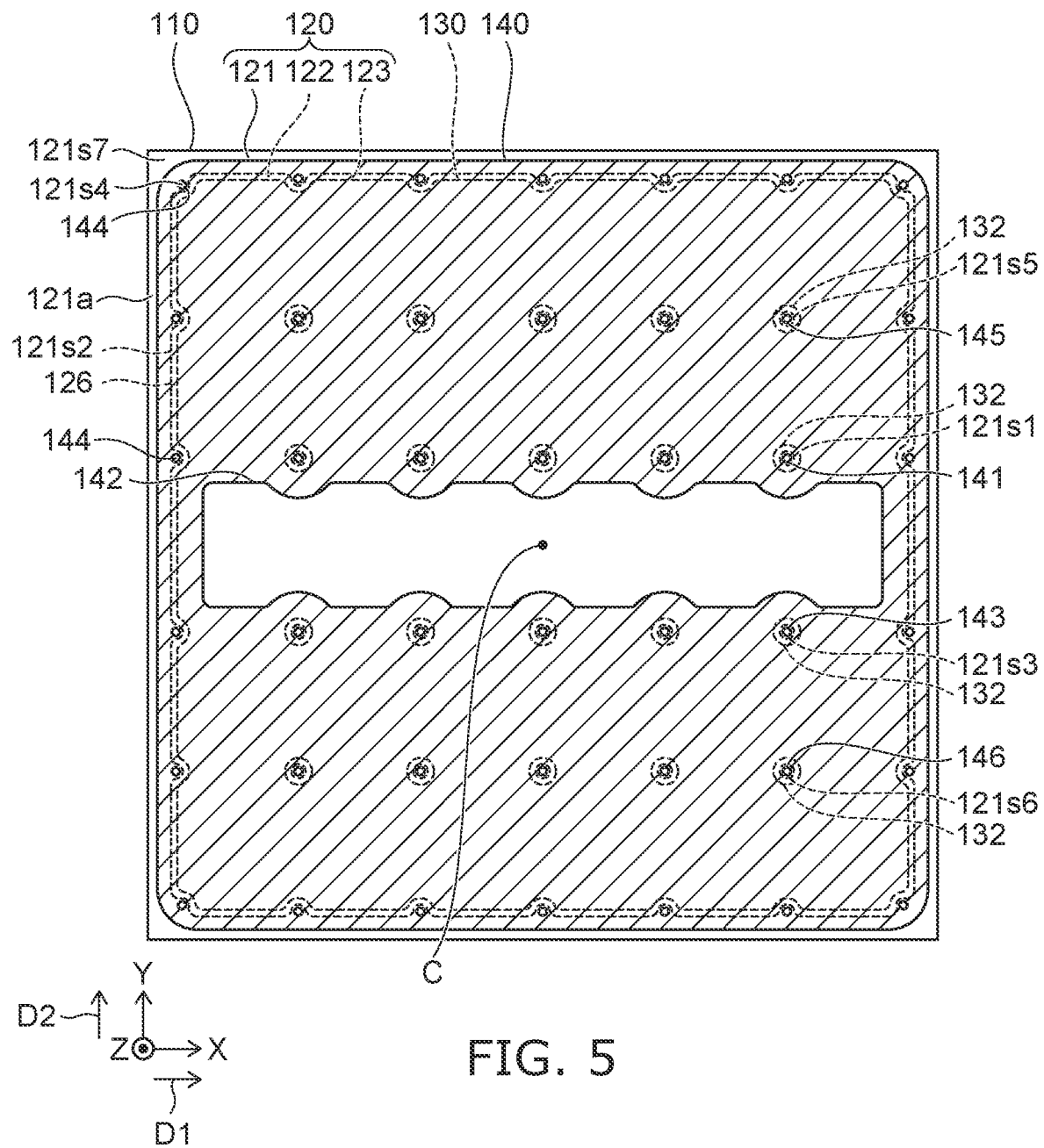
FIG. 5 illustrates a top view of other some components of the light-emitting element according to the first embodiment.

FIG. 5 illustrates a top view of the support substrate 110, the semiconductor structure 120, the third electrode 130, and the insulating film 140 of the light-emitting element 11 according to the present embodiment.

It is noted that, in FIG. 5, hatching is applied to the region where the insulating film 140 is disposed, for the purpose of facilitating understanding.

The insulating film 140 is disposed on the semiconductor structure 120 and the third electrode 130.

The insulating film 140 is made of an insulating material. The insulating material used for the insulating film 140 includes, for example, silicon oxide ($SiO_2$), silicon nitride (SiN), or the like.

In the top view of FIG. 5, the outer edge of the insulating film 140 is positioned inside the outer edge of the first semiconductor layer 121 and outside the plurality of fourth regions 121s4. The shape of the outer edge of the insulating film 140 in the top view is substantially rectangular having rounded corner portions. In an alternative embodiment, the outer edge of the insulating film in the top view may match the outer edge of the first semiconductor layer. A plurality of first openings 141, one second opening 142, a plurality of third openings 143, a plurality of fourth openings 144, a plurality of fifth openings 145, and a plurality of sixth openings 146 are disposed in the insulating film 140.

Each of the first regions 121s1 is exposed at the corresponding one of the first openings 141. In the top view, the area of each of the first openings 141 is less than the area of the corresponding one of the first regions 121s1. The top view shape of each of the first openings 141 is substantially similar to the top view shape of the corresponding one of the first regions 121s1. Similarly, each of the third regions 121s3 is exposed at the corresponding one of the third openings 143. In the top view, the area of each of the third openings 143 is less than the area of the corresponding one of the third regions 121s3. The top view shape of each of the third openings 143 is substantially similar to the top view shape of the corresponding one of the third regions 121s3.

Similarly, each of the fifth regions 121s5 is exposed at the corresponding one of the fifth openings 145. In the top view, the area of each of the fifth openings 145 is less than the area of the corresponding one of the fifth regions 121s5. The top view shape of each of the fifth openings 145 is substantially similar to the top view shape of the corresponding one of the fifth regions 121s5. Similarly, each of the sixth regions 121s6 is exposed at the corresponding one of the sixth openings 146. In the top view, the area of each of the sixth openings 146 is less than the area of the corresponding one of the sixth regions 121s6. The top view shape of each of the sixth openings 146 is substantially similar to the top view shape of the corresponding one of the sixth regions 121s6. In an alternative embodiment, the top view shape of each of the first openings may not be similar to the top view shape of the corresponding one of the first regions. Similarly, the top view shapes of the third openings, the fifth openings, and the sixth openings may not be similar to the top view shapes of the corresponding regions of the first semiconductor layer.

Each of the fourth regions 121s4 is exposed at the corresponding one of the fourth openings 144. The top view shape of each of the fourth openings 144 is substantially the same as the top view shapes of the first openings 141, the third openings 143, the fifth openings 145, and the sixth openings 146 and is substantially circular. In an alternative embodiment, the top view shape of each of the fourth openings may differ from the top view shapes of the first openings, the third openings, the fifth openings, and the sixth openings.

In the top view, a distance between a portion 126, which is a part of the second region 121s2 and is positioned between two fourth regions 121s4 that are closest to each other, and the outer edge of the first semiconductor layer 121 is substantially equal to a distance between the fourth opening 144 closest to the portion 126 and the outer edge of the first semiconductor layer 121. However, the positional relationship between the outer edge of the second region and the fourth opening of the insulating film is not limited to that described above.

The second opening 142 overlaps with the second semiconductor layer 123 in the top view. In the present embodiment, in the top view, the second opening 142 is positioned between the plurality of first regions 121s1 and the plurality of third regions 121s3 and on the center C of the semiconductor structure 120. This configuration makes it possible to reduce variation in density distribution of electric current in the active layer 122. A part of the third electrode 130 is exposed at the second opening 142. However, the position of the second opening 142 is not limited to that described above.

Of the regions of the upper surface 121a of the first semiconductor layer 121 that are not covered with the active layer 122 and the second semiconductor layer 123, the insulating film 140 covers a part of the outer peripheral region 121s7, the outer peripheral portion of each of the first regions 121s1, the outer peripheral portion of each of the third regions 121s3, the outer peripheral portion of each of the fourth regions 121s4, the outer peripheral portion of each of the fifth regions 121s5, and the outer peripheral portion of each of the sixth regions 121s6. Furthermore, the insulating film 140 covers a portion of the upper surface of the third electrode 130 excluding a portion positioned immediately below the second opening 142, a lateral surface of the third electrode 130, a lateral surface of the active layer 122, a lateral surface of the second semiconductor layer 123, and a portion of the upper surface of the second semiconductor layer 123 that is not covered with the third electrode 130.

Figure 6:
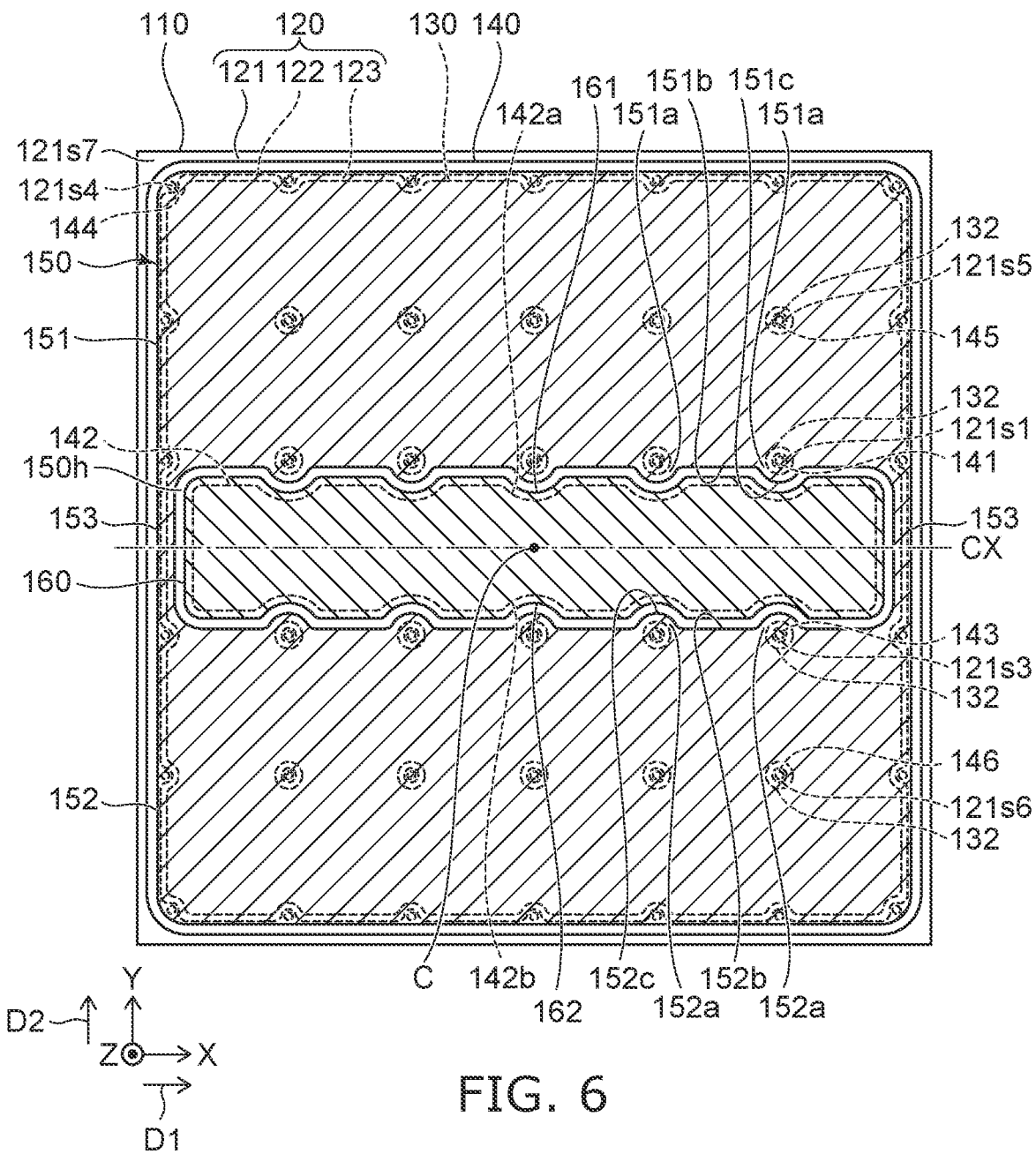
FIG. 6 illustrates a top view of other some components of the light-emitting element according to the first embodiment.

FIG. 6 illustrates a top view of the support substrate 110, the semiconductor structure 120, the third electrode 130, the insulating film 140, the first electrode 150, and the second electrode 160 of the light-emitting element 11 according to the present embodiment.

It is noted that, in FIG. 6, hatching patterns that differ from each other are applied to the region where the first electrode 150 is disposed and the region where the second electrode 160 is disposed, for the purpose of facilitating understanding.

The first electrode 150 and the second electrode 160 are disposed on the insulating film 140.

The first electrode 150 is made of a conductive material such as metal. The metal used for the first electrode 150 includes, for example, a type of metal having high light reflectivity with respect to light emitted from the active layer 122, which includes rhodium (Rh), nickel (Ni), gold (Au), silver (Ag), titanium (Ti) or the like. The first electrode 150 may be made of a layer of one of these metals, may have a structure in which layers of these metals are stacked, or may be made of an alloy containing these metals.

The first electrode 150 is disposed on the first semiconductor layer 121 and the insulating film 140 and is electrically connected to the first semiconductor layer 121 through the openings 141, 143, 144, 145, and 146. The expression "electrode is electrically connected to a semiconductor layer" as used herein includes not only a case in which the electrode is electrically connected to the semiconductor layer by being in contact with the semiconductor layer but also a case in which the electrode is electrically connected to the semiconductor layer through a conductive member.

In the present embodiment, in the top view of FIG. 6, the outer edge of the first electrode 150 is positioned inside the outer edge of the insulating film 140 and outside the plurality of fourth regions 121s4. The top view shape of the outer edge of the first electrode 150 is substantially similar to the top view shape of the outer edge of the insulating film 140. In an alternative embodiment, the top view shape of the outer edge of the first electrode may not be similar to the top view shape of the outer edge of the insulating film.

In addition, the first electrode 150 covers the plurality of first regions 121s1, the plurality of third regions 121s3, the plurality of fourth regions 121s4, the plurality of fifth regions 121s5, and the plurality of sixth regions 121s6. The first electrode 150 is disposed in each of the first openings 141 of the insulating film 140 and is in contact with the corresponding one of the first regions 121s1. Similarly, the first electrode 150 is disposed in each of the third openings 143 of the insulating film 140 and is in contact with the corresponding one of the third regions 121s3. Similarly, the first electrode 150 is disposed in each of the fourth openings 144 of the insulating film 140 and is in contact with the corresponding one of the fourth regions 121s4. Similarly, the first electrode 150 is disposed in each of the fifth openings 145 of the insulating film 140 and is in contact with the corresponding one of the fifth regions 121s5. Similarly, the first electrode 150 is disposed in each of the sixth openings 146 of the insulating film 140 and is in contact with the corresponding one of the sixth regions 121s6. In an alternative embodiment, the first electrode 150 may be electrically connected to the first semiconductor layer 121 through a conductive member, rather than being electrically connected to the first semiconductor layer 121 by being in direct contact with the first semiconductor layer 121.

With the first electrode 150 being electrically connected to the plurality of fourth regions 121s4 through the plurality of corresponding fourth openings 144, carriers are more easily supplied to the outer peripheral region of the active layer 122. This makes it possible to further reduce variation in density distribution of electric current in the active layer 122.

The first electrode 150 includes a through-hole 150h where the second opening 142 of the insulating film 140 is exposed. In the top view, the through-hole 150h is positioned between the plurality of first regions 121s1 and the plurality of third regions 121s3. In the top view, the area of the through-hole 150h is greater than the area of the second opening 142.

The second electrode 160 is disposed in the through-hole 150h so as to be spaced apart from the first electrode 150. A material similar to that of the first electrode 150 may be used for the second electrode 160. The second electrode 160 is disposed on the insulating film 140 and is electrically connected to the second semiconductor layer 123 through the second opening 142. In the top view, the area of the second electrode 160 is less than the area of the through-hole 150h and is greater than the area of the second opening 142. Thus, a portion of the second electrode 160 that is positioned around the second opening 142 is positioned on the insulating film 140. A part of the second electrode 160 is disposed in the second opening 142 and is in contact with the third electrode 130. Thus, the second electrode 160 is electrically connected to the second semiconductor layer 123. In an alternative embodiment, the third electrode 130 may not be disposed in the light-emitting element 11. In this case, the second electrode 160 may be electrically connected to the second semiconductor layer 123 by being in direct contact with the second semiconductor layer 123, rather than being electrically connected to the second semiconductor layer 123 through a conductive member such as the third electrode 130.

The first electrode 150 includes a first electrode region 151 positioned on the +Y side of the through-hole 150h, a second electrode region 152 positioned on the –Y side of the through-hole 150h, and two third electrode regions 153 each disposed adjacent to the through-hole 150h in the X direction. The through-hole 150h is positioned between the two third electrode regions 153.

The first electrode region 151 covers at least the plurality of first regions 121s1 in the top view and is adjacent to the second electrode 160 in the second direction D2. In the present embodiment, the first electrode region 151 further covers the plurality of fifth regions 121s5 and 11 fourth regions 121s4 positioned on the +Y side of the straight line CX in the top view from among 22 fourth regions 121s4.

The first electrode region 151 includes a plurality of first portions 151a that cover the plurality of corresponding first regions 121s1, and a plurality of second portions 151b each positioned between adjacent first portions 151a. Each of the first portions 151a includes a first extending portion 151c extending from the first electrode region 151 in a direction toward the second electrode 160, that is in the –Y direction, further than the second portion 151b. For example, the outer edge of each of the second portions 151b extends substantially in the first direction D1. The top view shape of the outer edge of each of the first extending portions 151c is, for example, a shape according to the corresponding one of the first regions 121s1 and is substantially arcuate.

The second electrode region 152 covers at least the plurality of third regions 121s3 in the top view and is adjacent to the second electrode 160 in the second direction D2. In the present embodiment, the second electrode region 152 further covers the plurality of sixth regions 121s6 and 11 fourth regions 121s4 positioned on the –Y side of the straight line CX in the top view from among 22 fourth regions 121s4.

The second electrode region 152 includes a plurality of third portions 152a that cover the plurality of corresponding third regions 121s3, and a plurality of fourth portions 152b each positioned between adjacent third portions 152a. Each of the third portions 152a includes a second extending portion 152c extending from the second electrode region 152 in a direction toward the second electrode 160, that is in the +Y direction, further than the fourth portion 152b. For example, the outer edge of each of the fourth portions 152b extends substantially in the first direction D1. The top view shape of the outer edge of each of the second extending portions 152c is, for example, a shape according to the corresponding one of the third regions 121s3 and is substantially arcuate.

One of the two third electrode regions 153 is positioned between an end portion, in the –X direction, of the first electrode region 151 and an end portion, in the –X direction, of the second electrode region 152 and is connected to the end portion, in the –X direction, of the first electrode region 151 and the end portion, in the –X direction, of the second electrode region 152. The other one of the two third electrode regions 153 is positioned between an end portion, in the +X direction, of the first electrode region 151 and an end portion, in the +X direction, of the second electrode region 152 and is connected to the end portion, in the +X direction, of the first electrode region 151 and the end portion, in the +X direction, of the second electrode region 152. Each of the third electrode regions 153 extends substantially in the second direction D2.

The through-hole 150h of the first electrode 150 is a region surrounded by the first electrode region 151, the second electrode region 152, and the two third electrode regions 153 and has a shape according to the first electrode region 151, the second electrode region 152, and the two third electrode regions 153.

In the present embodiment, the top view shape of the second electrode 160 is substantially similar to the top view shape of the through-hole 150h.

The second electrode 160 includes a plurality of first recessed portions 161 corresponding to the plurality of first extending portions 151c. The top view shape of each of the first recessed portions 161 corresponds to the top view shape of the corresponding one of the first extending portions 151c and is, for example, substantially arcuate.

A region of the first semiconductor layer 121 that is in contact with the first electrode 150 cannot be positioned immediately below the second electrode 160. According to the light-emitting element 11 of the present embodiment, it is possible to dispose the plurality of first regions 121s1 of the first semiconductor layer 121 that is in contact with the first electrode 150, close to the second electrode 160 in the top view. This makes it easy to supply carriers to a portion of the active layer 122 that is positioned immediately below the second electrode 160. As a result, it is possible to reduce variation in density distribution of electric current in the active layer 122. This further leads to reduction of brightness unevenness of the light-emitting element 11.

The second electrode 160 includes a plurality of second recessed portions 162 corresponding to the plurality of second extending portions 152c. The top view shape of each of the second recessed portions 162 corresponds to the top view shape of the corresponding one of the second extending portions 152c and is, for example, substantially arcuate.

According to such a configuration of the second electrode 160, it is possible to create a space for disposing the plurality of second conductive members 172 on the second electrode 160 while further reducing the brightness unevenness of the light-emitting element 11. In addition, when the light-emitting element 11 is mounted on the substrate 12, it is possible to reduce a possibility that the second conductive member 172 protrudes out from the top of the second electrode 160 and is brought into contact with the first electrode 150.

In the present embodiment, the top view shape of the second opening 142 of the insulating film 140 is substantially similar to the top view shape of the through-hole 150h. A plurality of first recessed portions 142a corresponding to the plurality of first extending portions 151c and a plurality of second recessed portions 142b corresponding to the plurality of second extending portions 152c are disposed at the second opening 142. In an alternative embodiment, the top view shape of the second opening may not be similar to the top view shape of the through-hole of the first electrode or the shape of the second electrode.

As illustrated in FIGS. 1 and 2, the plurality of first conductive members 171 are disposed on the first electrode 150. The top view shape of each of the first conductive member 171 is, for example, substantially elliptical. However, the top view shape of the first conductive member is not limited to that described above. For example, the top view shape of the first conductive member may be circular, rectangle with rounded corners, polygonal with rounded corner portions, or the like. Each of the first conductive members 171 can be formed, for example, through a plating method or the like. For each of the first conductive members 171, it is possible to use gold (Au), silver (Ag), copper (Cu), platinum (Pt), zinc (Zn), nickel (Ni), or an alloy of these materials.

In the example illustrated in FIG. 1, the number of the first conductive members 171 is 24. In the example illustrated in FIG. 1, the plurality of first conductive members 171 are disposed so as not to overlap with the openings 132 of the third electrode 130 in the top view. Specifically, of the 24 first conductive members 171, six first conductive members 171 are positioned between a straight line extending in the X direction through the center of the fourth region 121s4 positioned on the most +Y side and a straight line extending in the X direction through the center of the fifth region 121s5, in the top view. These six first conductive members 171 are aligned in the X direction.

In addition, six first conductive members 171 other than described above of the 24 first conductive members 171 are positioned between a straight line extending in the X direction through the center of the fifth region 121s5 and a straight line extending in the X direction through the center of the first region 121s1, in the top view. These six first conductive members 171 are aligned in the X direction.

Furthermore, six first conductive members 171 other than described above of the 24 first conductive members 171 are positioned between a straight line extending in the X direction through the center of the third region 121s3 and a straight line extending in the X direction through the center of the sixth region 121s6, in the top view. These six first conductive members 171 are aligned in the X direction.

In addition, the remaining six first conductive members 171 of the 24 first conductive members 171 are positioned between a straight line extending in the X direction through the center of the sixth region 121s6 and a straight line extending in the X direction through the center of the fourth region 121s4 positioned on the most −Y side, in the top view. These six first conductive members 171 are aligned in the X direction.

In the example illustrated in FIG. 1, adjacent first conductive members 171 are separate from each other. In an alternative embodiment, adjacent first conductive members may be in contact with each other. Furthermore, the number of and the position of the first conductive members are not limited to those described above.

The plurality of second conductive members 172 are disposed on the second electrode 160. The top view shape of each of the second conductive members 172 is, for example, substantially elliptical. In an alternative embodiment, the top view shape of the second conductive member is not limited to that described above. For example, the top view shape of the second conductive member may be circular, oval, polygonal with rounded corner portions, or the like. Each of the second conductive members 172 can be formed, for example, through a plating method or the like. For each of the second conductive members 172, it is possible to use a material similar to the material for the first conductive members 171.

In the example illustrated in FIG. 1, the number of the second conductive members 172 is six. However, the number of the second conductive members is not limited to that described above. The six second conductive members 172 are lined up in the first direction D1. The center of each of the second conductive members 172 is positioned substantially on the straight line CX in the top view. In the example illustrated in FIG. 1, second conductive members 172 that are adjacent to each other in the X direction are in contact with each other. In an alternative embodiment, second conductive members that are adjacent to each other in the X direction may be spaced apart from each other.

Each of the second conductive members 172 includes a first end portion 172t1 closest to the first electrode region 151 in the second direction D2, and a second end portion 172t2 closest to the second electrode region 152 in the second direction D2.

In the top view of FIG. 1, the plurality of first extending portions 151c are positioned proximate to the second portion 151b relative to a first straight line Ld1, that is, on the +Y side of the first straight line Ld1. The first straight line Ld1 extends in the first direction D1 through a first end portion 172t1 of the plurality of first end portions 172t1 that is closest to the first electrode region 151. Thus, it is possible to create a space for disposing the plurality of second conductive members 172 while reducing the brightness unevenness of the light-emitting element 11. This makes it easy to mount the light-emitting element 11 on the substrate 12. In addition, when the second conductive member 172 is connected to the second wiring line 12c of the substrate 12, the second conductive member 172 may be crushed between the semiconductor structure 120 and the substrate 12 to be deformed. Even in such a case, it is possible to reduce a possibility that the second conductive member 172 protrudes out from the top of the second electrode 160 and is brought into contact with the first electrode 150. Thus, it is possible to improve yield when the light-emitting element 11 is mounted on the substrate 12. In the present embodiment, all the first end portions 172t1 are positioned on the first straight line Ld1 in the top view. In an alternative embodiment, not all the first end portions may be positioned on the first straight line in the top view.

Similarly, in the top view of FIG. 1, the plurality of second extending portions 152c are positioned proximate to the fourth portion 152b relative to a second straight line Ld2, that is, on the −Y side of the second straight line Ld2. The second straight line Ld2 extends in the first direction D1 through a second end portion 172t2 of the plurality of second end portions 172t2 that is closest to the second electrode region 152. In the present embodiment, all the second end portions 172t2 are positioned on the second straight line Ld2 in the top view. In an alternative embodiment, not all the second end portions may be positioned on the second straight line in the top view.

In addition, in the top view, the plurality of first recessed portions 161 of the second electrode 160 are positioned proximate to the second portion 151b relative to the first straight line Ld1, that is, on the +Y side of the first straight line Ld1. This makes it possible to create a space for disposing the plurality of second conductive members 172 on the second electrode 160. Furthermore, when the light-emitting element 11 is mounted on the substrate 12, it is possible to reduce a possibility that the second conductive member 172 protrudes out from the top of second electrode 160 and is brought into contact with the first electrode 150. In addition, in the top view, the plurality of second recessed portions 162 are positioned proximate to the fourth portion 152b relative to the second straight line Ld2, that is, on the −Y side of the second straight line Ld2. This makes it possible to create a space for disposing the plurality of second conductive members 172 on the second electrode 160. In addition, when the light-emitting element 11 is mounted on the substrate 12, it is possible to reduce a possibility that the second conductive member 172 protrudes out from the top of the second electrode 160 and is brought into contact with the first electrode 150. However, the positional relationship between the plurality of first recessed portions and the first straight line and the positional relationship between the plurality of second recessed portions and the second straight line are not limited to those described above.

Furthermore, in the top view of FIG. 1, the plurality of second conductive members 172 are positioned inside the second opening 142. In the top view, a portion of the outer edge of the second opening 142 that is positioned between the plurality of second conductive members 172 and the first electrode region 151 is positioned proximate to the first electrode region 151 relative to the first straight line Ld1. This configuration makes it possible to increase the area of the second opening 142 and also reduce the possibility that the second conductive member 172 is disposed across the insulating film 140 from the second opening 142 in the top view. Thus, it is possible to reduce variation in the height of the upper surface of the second conductive member 172. In the top view, a portion of the outer edge of the second opening 142 that is positioned between the plurality of second conductive members 172 and the second electrode region 152 is positioned proximate to the second electrode region 152 relative to the second straight line Ld2. However, the position of the outer edge of the second opening is not limited to that described above.

The distance L3 between the center of the first conductive member 171 and the center of the second conductive member 172 is greater than the distance L4 between the centers of two first conductive members 171 adjacent to each other in the Y direction. However, the magnitude relationship of these distances is not limited to that described above.

Figure 7:
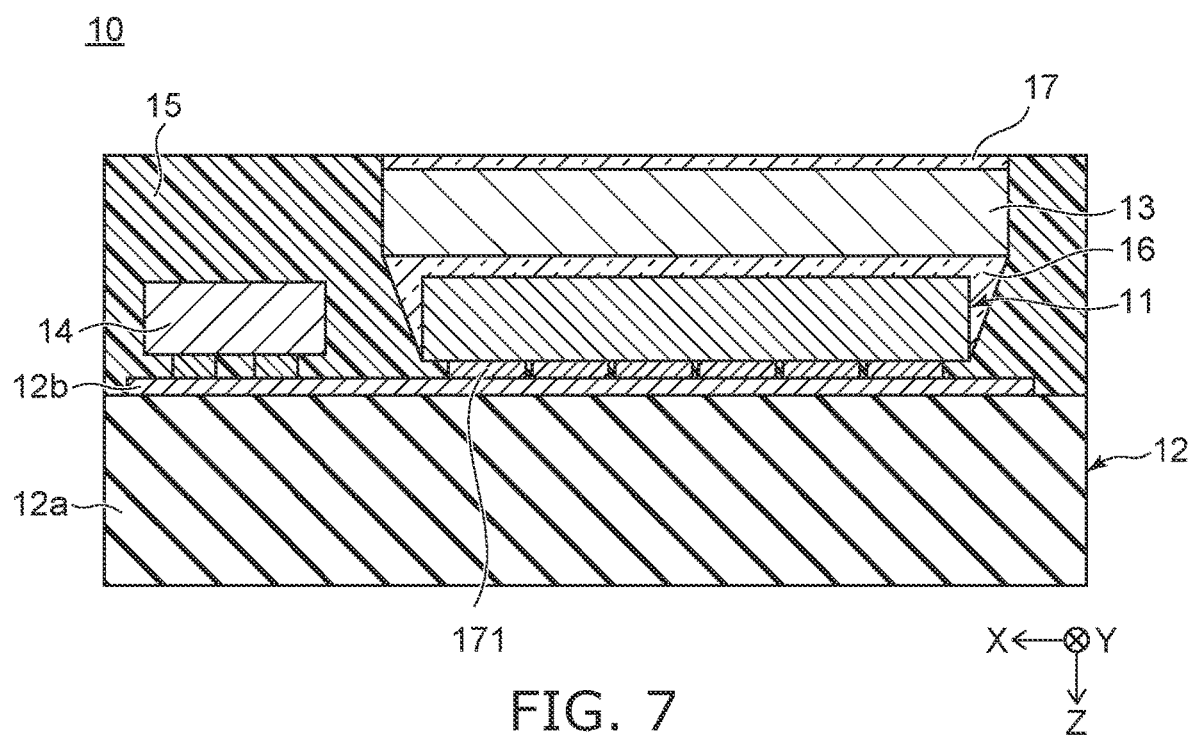
FIG. 7 illustrates a cross-sectional view of a light-emitting device according to the first embodiment.

Next, a light-emitting device 10 according to the present embodiment will be described. FIG. 7 illustrates a cross-sectional view of the light-emitting device 10 according to the present embodiment.

Figure 8:
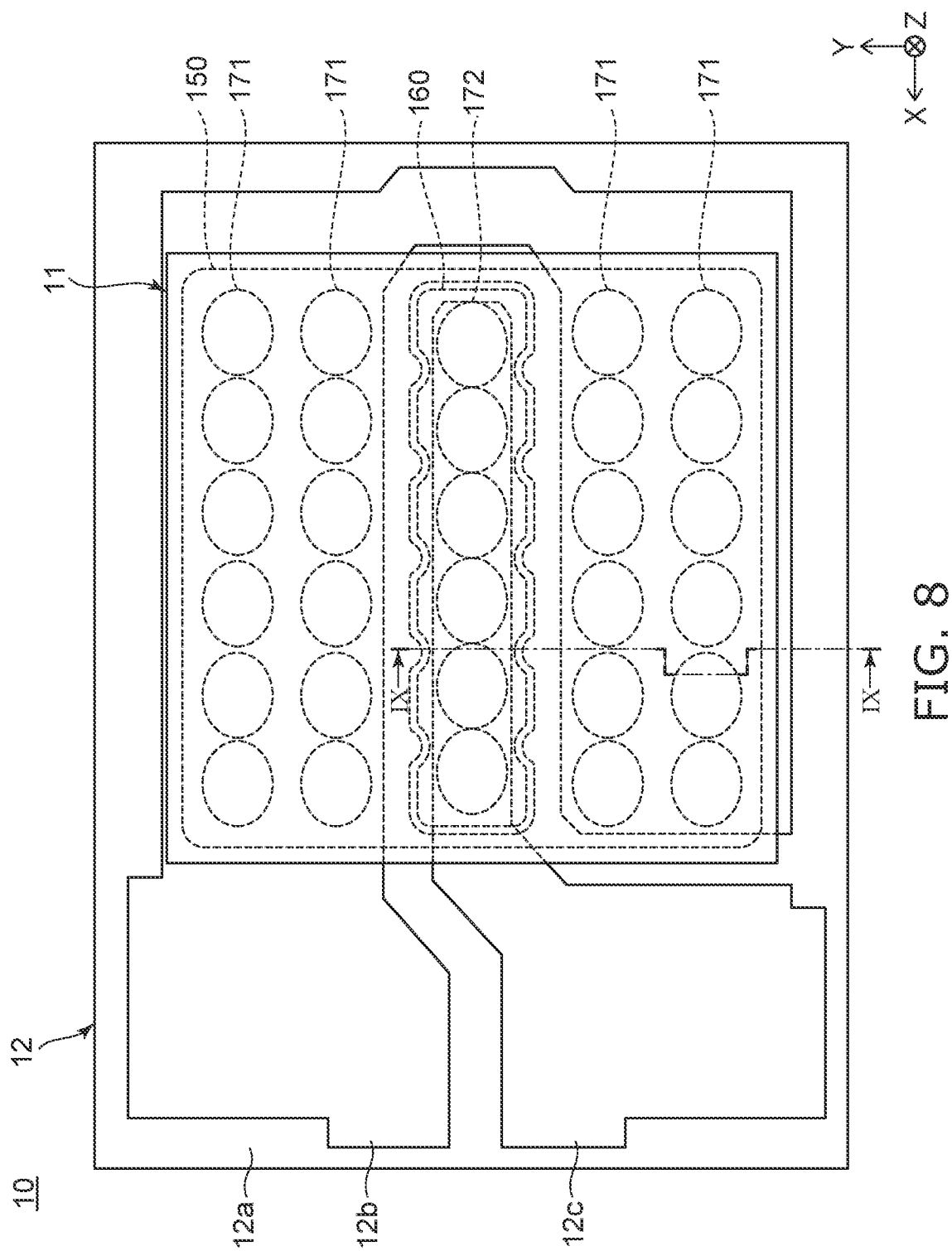
FIG. 8 illustrates a top view of some components of the light-emitting device according to the first embodiment.

FIG. 8 illustrates a top view of the light-emitting element 11 and the substrate 12 of the light-emitting device 10 according to the present embodiment.

Figure 9:
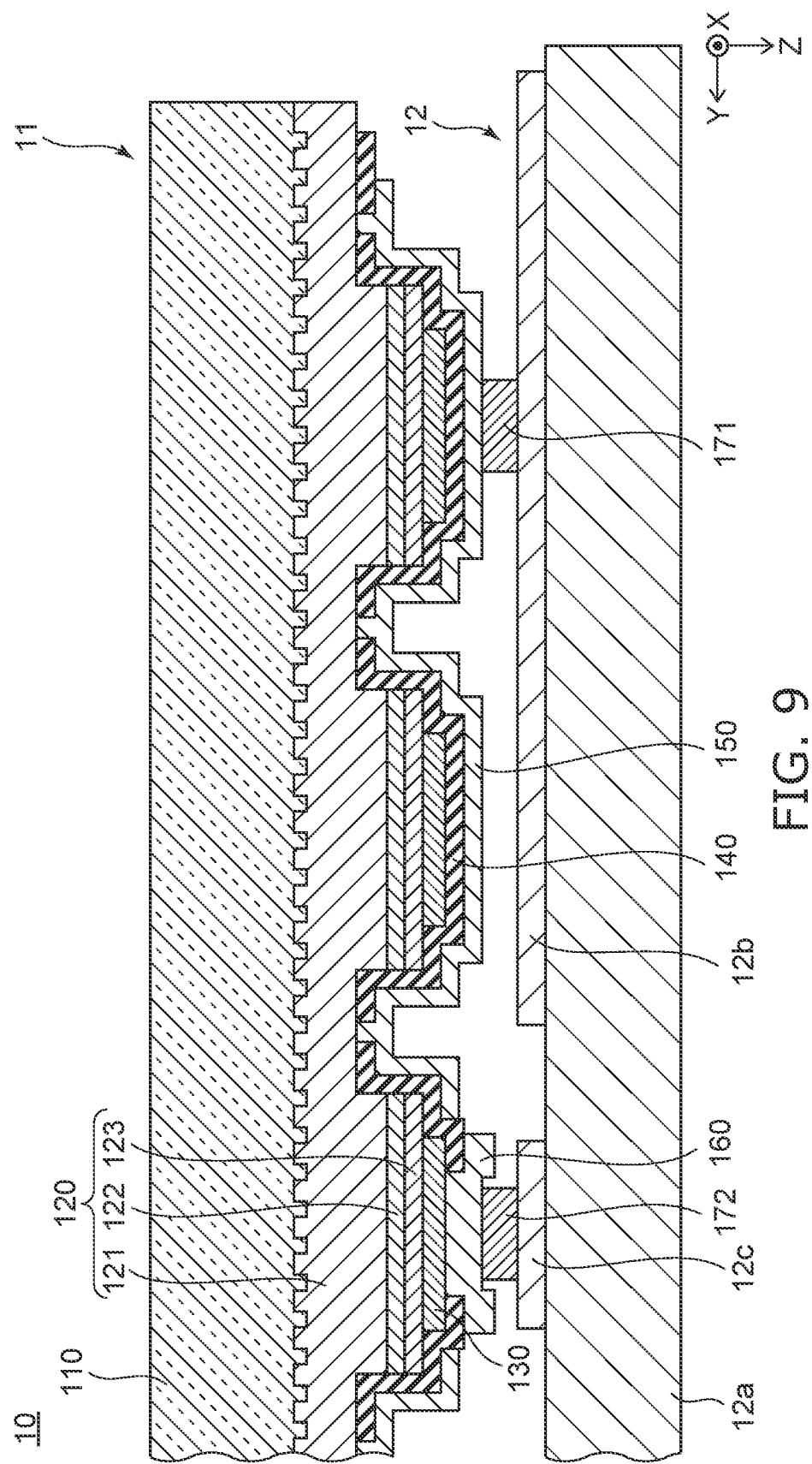
FIG. 9 illustrates a cross-sectional view of the light-emitting device taken along line IX-IX in FIG. 8.

FIG. 9 illustrates a cross-sectional view of the light-emitting device 10 taken along line IX-IX in FIG. 8.

The light-emitting device 10 includes the light-emitting element 11 and the substrate 12. It is noted that, in FIG. 7, portions of the light-emitting element 11 other than the first conductive member 171 are simply grouped together and illustrated as a quadrangle shape. In the present embodiment, the light-emitting device 10 further includes a wavelength conversion member 13, a protective element 14, and a light reflective member 15.

As illustrated in FIGS. 8 and 9, the substrate 12 includes an insulating member 12a, a first wiring line 12b electrically connected to the plurality of first conductive members 171, and a second wiring line 12c spaced apart from the first wiring line 12b and electrically connected to the plurality of second conductive members 172. The first wiring line 12b and the second wiring line 12c are disposed on the insulating member 12a.

Flip chip bonding is used to mount the light-emitting element 11 on the substrate 12. Specifically, the light-emitting element 11 is disposed such that the plurality of first conductive members 171 are opposed to the first wiring line 12b and the plurality of second conductive members 172 are opposed to the second wiring line 12c. As each of the first conductive members 171 is brought into contact with the first wiring line 12b, each of the first conductive members 171 is electrically connected to the first wiring line 12b. Similarly, as each of the second conductive members 172 is brought into contact with the second wiring line 12c, each of the second conductive members 172 is electrically connected to the second wiring line 12c. Electric power is supplied to the light-emitting element 11 through the first wiring line 12b and the second wiring line 12c, which causes the active layer 122 of the semiconductor structure 120 to emit light. The first wiring line 12b includes a first stretching portion that extends in the X direction and is opposed to the first electrode region 151, a second stretching portion that extends in the X direction and is opposed to the second electrode region 152, and a connecting portion positioned between an end portion, in the −X direction, of the first stretching portion and an end portion, in the −X direction, of the second stretching portion and connected to the first stretching portion and the second stretching portion. The second wiring line 12c is positioned between the first stretching portion and the second stretching portion of the first wiring line 12b.

As illustrated in FIG. 7, the wavelength conversion member 13 is fixed, in a state of being disposed so as to be opposed to the support substrate 110 of the light-emitting element 11, to the light-emitting element 11 via an adhesive member 16 having transmissivity. The wavelength conversion member 13 includes a wavelength conversion substance that emits, in response to entry of light emitted by the light-emitting element 11, light having an emission peak wavelength different from an emission peak wavelength of the light emitted by the light-emitting element 11. The shape of the wavelength conversion member 13 is, for example, a planar plate substantially parallel to the XY plane. A protection layer 17 having transmissivity may be disposed on the wavelength conversion member 13.

The protective element 14 is, for example, a Zener diode. The protective element 14 is electrically connected to each of the wiring lines 12b and 12c and electrically protects the light-emitting element 11.

The light reflective member 15 is disposed on the substrate 12 and around the light-emitting element 11 and the wavelength conversion member 13 and covers the protective element 14. The light reflective member 15 includes a resin member and light reflective particles disposed in the resin member. For the resin member, it is possible to use silicone resin or thermosetting resin such as epoxy resin. For the light reflective particles, it is possible to use silicon oxide (SiO₂), titanium oxide (TiO₂), aluminum (Al), silver (Ag), or the like.

The configuration of the light-emitting device 10 is not limited to that described above. For example, the light-emitting element 11 may be fixed on the substrate 12 through an adhesive member.

Second Embodiment

Figure 10:
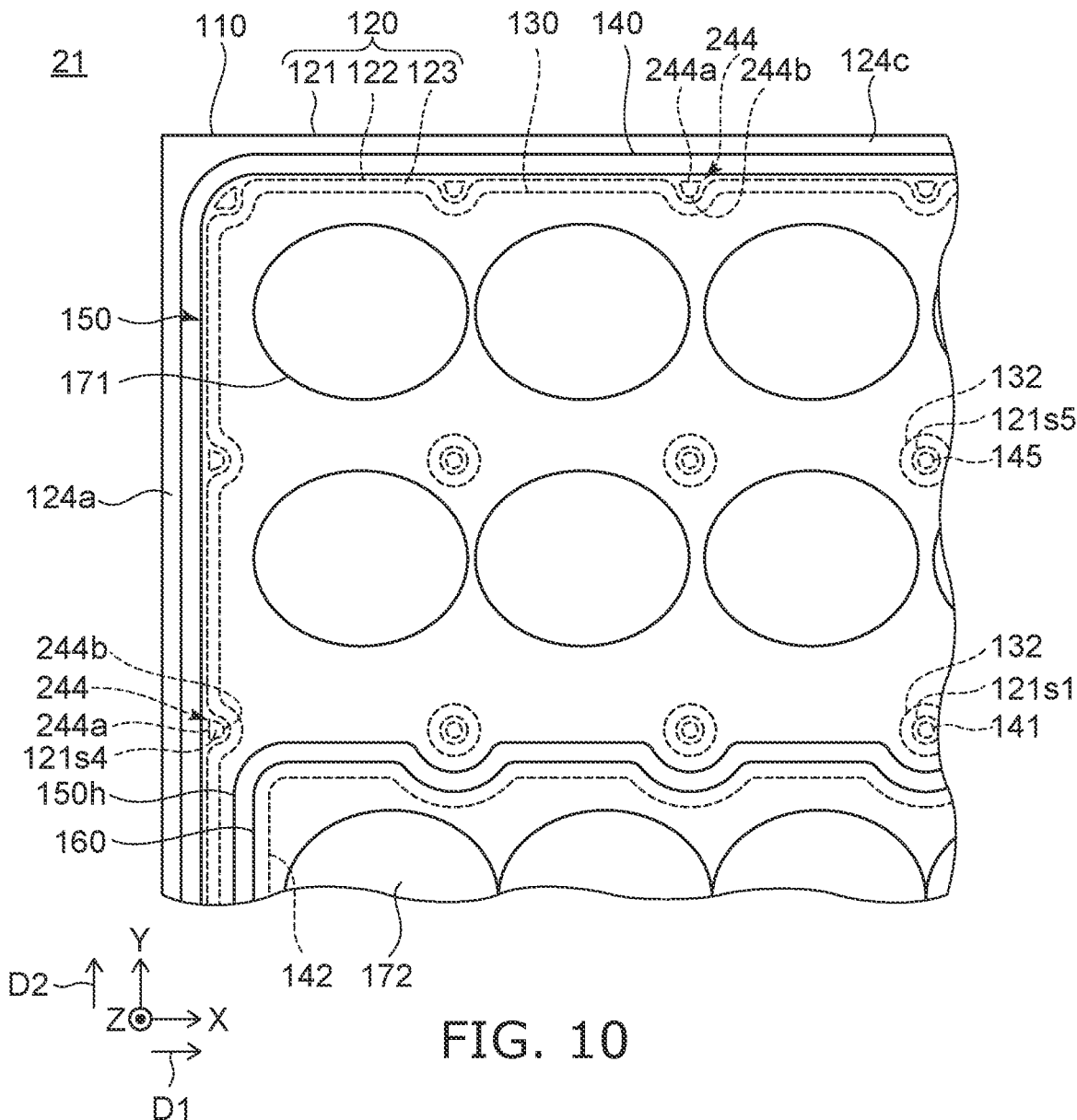
FIG. 10 illustrates a top view of a part of a light-emitting element according to a second embodiment in an enlarged manner.

FIG. 10 illustrates a top view of a portion of a light-emitting element 21 according to a second embodiment in an enlarged manner.

The light-emitting element 21 according to the present embodiment differs from the light-emitting element 11 according to the first embodiment in the shape of a fourth opening 244 of an insulating film 140.

It is noted that, in the following description, explanation is basically made mainly of points different from the first embodiment. The light-emitting element 21 according to the present embodiment has a configuration similar to that of the first embodiment except for the points to be described below. The same applies to other embodiments to be described below as well.

Each of the fourth regions 121s4 is exposed at the corresponding one of the fourth openings 244. In the top view of FIG. 10, a portion 244a of the outer edge of each of the fourth openings 244 that is adjacent to the outer edge of the first electrode 150 extends parallel to the outer edge of the first electrode 150. In addition, in the top view, a portion 244b of the outer edge of each of the fourth openings 244 that is positioned inside the portion 244a is curved in a manner protruding toward the inside. For example, the portion 244a adjacent to the outer edge of the first electrode 150 extends in the Y direction and the portion 244b positioned inside the portion 244a is curved in a manner protruding toward the +X direction at a fourth opening 244 where a fourth region 121s4 connected to the first stretching portion 124a of the outer peripheral region 121s7 is exposed. Furthermore, for example, the portion 244a adjacent to the outer edge of the first electrode 150 extends in the X direction and the portion 244b positioned inside the portion 244a is curved in a manner protruding toward the -Y direction at a fourth opening 244 where a fourth region 121s4 connected to the third stretching portion 124c of the outer peripheral region 121s7 is exposed.

In the light-emitting element 21 according to the present embodiment, it is possible to increase the area of the fourth opening 244, which makes it possible to increase a contact area between the first electrode 150 and each of the fourth regions 121s4.

Third Embodiment

Figure 11:
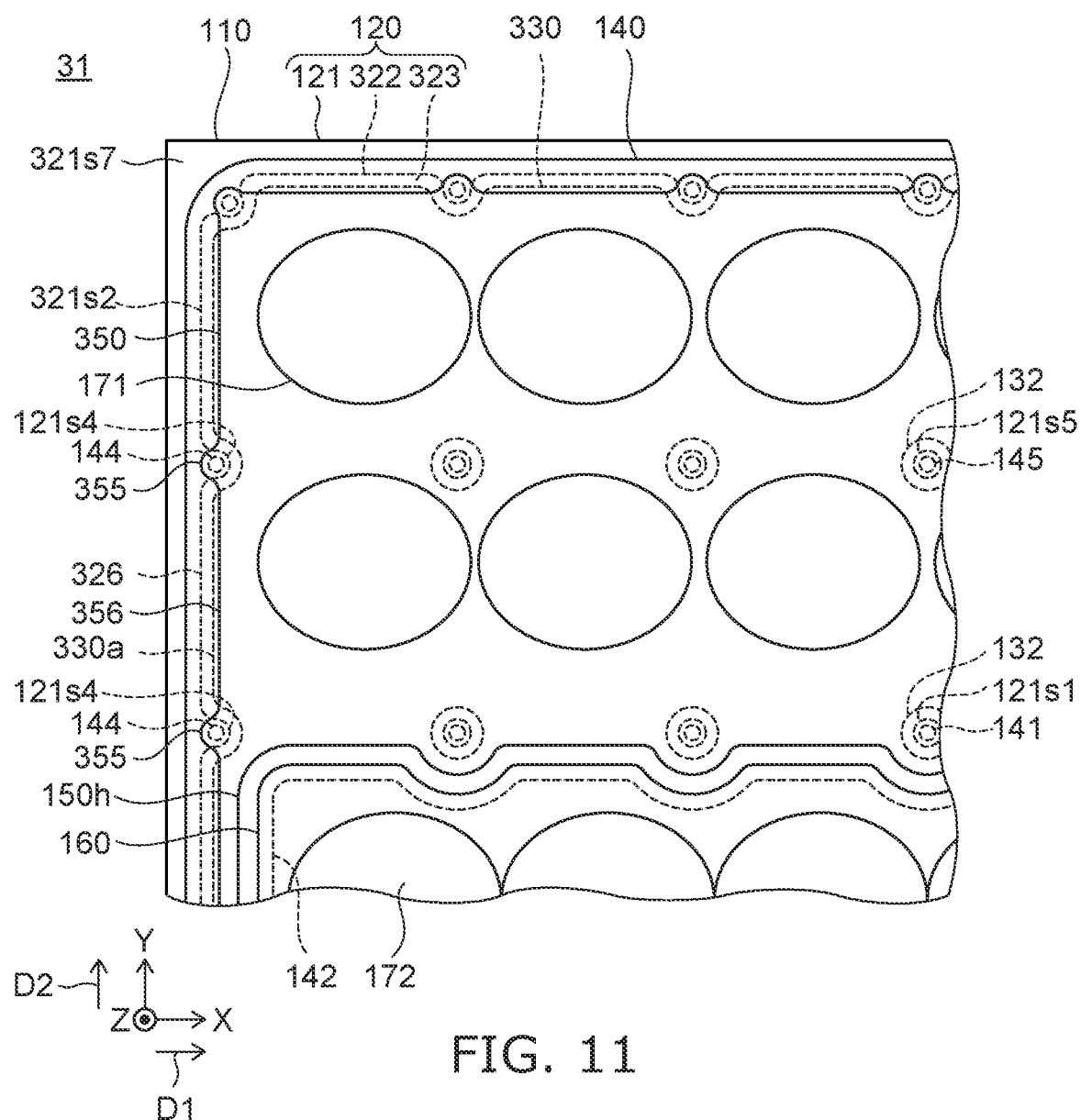
FIG. 11 illustrates a top view of a part of a light-emitting element according to a third embodiment in an enlarged manner.

FIG. 11 illustrates a top view of a portion of a light-emitting element 31 according to a third embodiment in an enlarged manner.

The light-emitting element 31 according to the present embodiment differs from the light-emitting element 11 according to the first embodiment in the shape of the boundary between an outer peripheral region 321s7 and a second region 321s2 of the first semiconductor layer 121 and the shape of a first electrode 350.

In the top view of FIG. 11, a portion 326 of the second region 321s2 that is positioned between two fourth regions 121s4 closest to each other protrudes outward further than a fourth opening 144 that is closest to the portion 326. That is, in the top view, a distance between the outer edge of the first semiconductor layer 121 and the portion 326 of the second region 321s2 that is positioned between the plurality of fourth regions 121s4 is less than a distance between a fourth opening 144 closest to this portion 326 and the outer edge of the first semiconductor layer 121. An active layer 322 and a second semiconductor layer 323 cover the second region 321s2. A third electrode 330 is disposed on the second semiconductor layer 323. In the top view, the area of the third electrode 330 is less than the area of the second region 321s2. The top view shape of the third electrode 330 is substantially similar to the top view shape of the second region 321s2.

The outer peripheral portion of the first electrode 350 includes a plurality of fifth portions 355 that cover the plurality of corresponding fourth regions 121s4 and a sixth portion 356 positioned between adjacent fifth portions 355. In the top view, the sixth portion 356 is positioned inside the outer peripheral region 321s7 of the first semiconductor layer 121. In the present embodiment, the sixth portion 356 is positioned inside a portion 330a of the outer edge of the third electrode 330 that is positioned between adjacent fourth regions 121s4, in the top view.

In the first embodiment, the outer edge of the first electrode 150 is positioned on the outer peripheral region 121s7. In contrast, in the present embodiment, the outer peripheral region 321s7 is positioned outside the sixth portion 356. According to this configuration, it is possible to widen the second region 321s2 by this amount. That is, it is possible to increase the areas of the active layer 322 and the second semiconductor layer 323 in the top view. This enables the light-emitting plane of the light-emitting element 31 to be greater than that of the light-emitting element 11 of the first embodiment. In addition, by increasing the area of the second semiconductor layer 323 in the top view, it is possible to increase the area of the third electrode 330 disposed on the second semiconductor layer 323 in the top view. This makes it possible to increase the light reflective region by the third electrode 330. Thus, it is possible to improve efficiency in extracting light from the light-emitting element 31.

Fourth Embodiment

Figure 12:
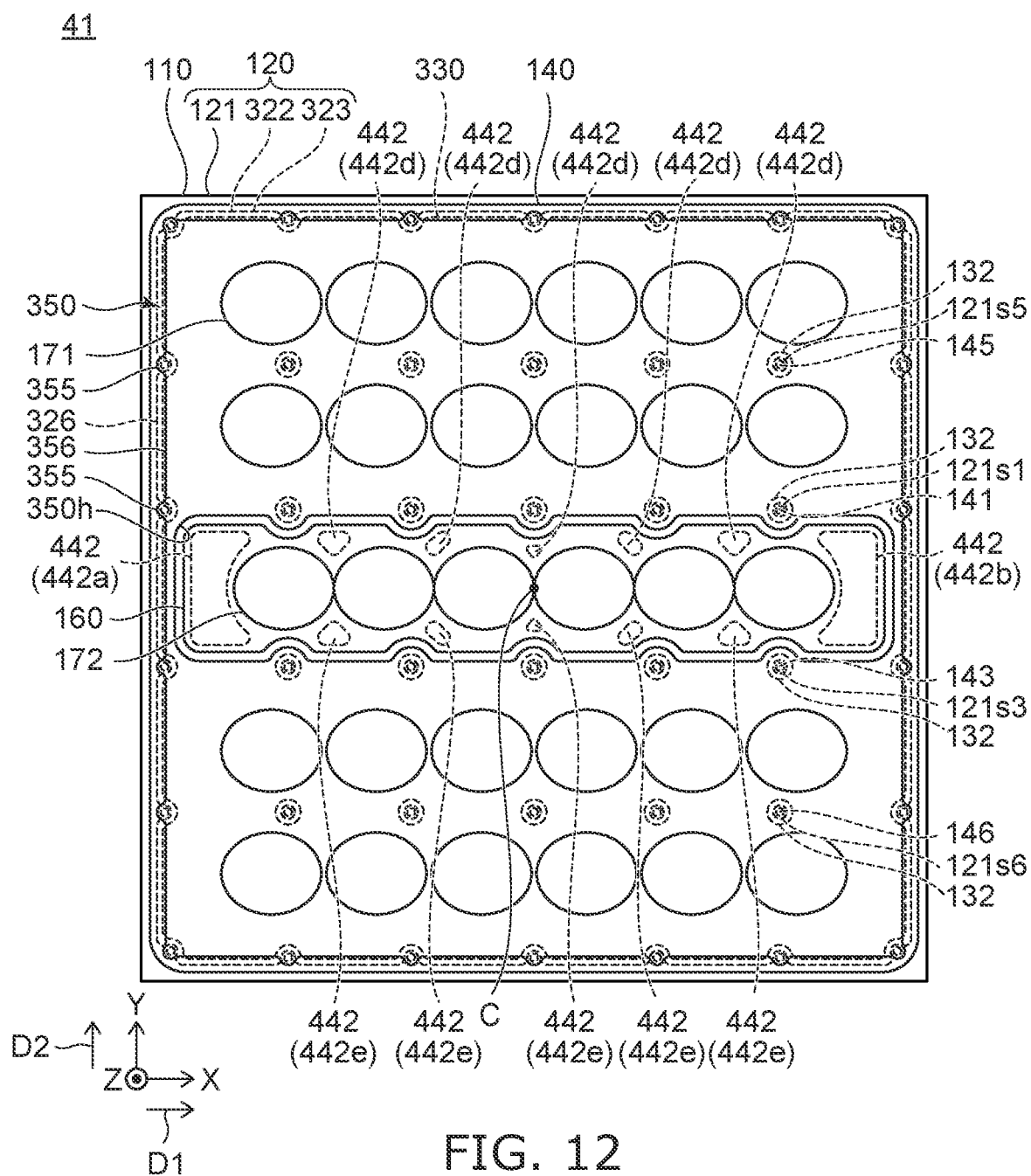
FIG. 12 illustrates a top view of a light-emitting element according to a fourth embodiment.

FIG. 12 illustrates a top view of a light-emitting element 41 according to a fifth embodiment.

The light-emitting element 41 according to the present embodiment differs from the light-emitting element 11 according to the first embodiment in that the insulating film 140 includes a plurality of second openings 442. It is noted that the shape of the boundary between the outer peripheral region and the second region of the first semiconductor layer 121 and the shape of the first electrode 350 are configured in a manner similar to that of the third embodiment, and hence, explanation thereof will not be repeated.

A plurality of second openings 442 are disposed at the insulating film 140. The second electrode 160 covers the plurality of second openings 442. The second electrode 160 is disposed in each of the second openings 442 and is in contact with the third electrode 330. With this configuration, the second electrode 160 is electrically connected to the second semiconductor layer 323.

In the top view, each of the second openings 442 is disposed so as to overlap with the second semiconductor layer 323 and so as not to overlap with the plurality of second conductive members 172. This makes it easy to align the upper end of the second conductive member 172 with the upper end of the first conductive member 171. Thus, the light-emitting element 41 can be easily mounted on the substrate 12.

In the example illustrated in FIG. 12, the insulating film 140 includes 12 second openings 442. In the top view of FIG. 12, one second opening 442a of the 12 second openings 442 is positioned on the −X side of a second conductive member 172 positioned on the most −X side. In the top view, another second opening 442b of the 12 second openings 442 is positioned on the +X side of a second conductive member 172 positioned on the most +X side. The top view shapes of these two second openings 442a and 442b are substantially symmetrical with respect to a plane passing through the center C of the first semiconductor layer 121 and parallel to the YZ plane.

In the top view, five second openings 442d of the 12 second openings 442 are positioned between an end portion, in the +Y direction, of the second electrode 160 and the plurality of second conductive members 172. Each of the second openings 442d is disposed such that the position thereof in the X direction is between the centers of adjacent second conductive members 172 in the X direction. For example, the areas of the five second openings 442d are configured such that the second opening 442d disposed closer to the center C of the semiconductor structure 120 has a smaller area.

In the top view, the remaining five second openings 442e of the 12 second openings 442 are positioned between an end portion, in the −Y direction, of the second electrode 160 and the plurality of second conductive members 172. Each of the second openings 442e is disposed such that the position thereof in the X direction is between the centers of adjacent second conductive members 172 in the X direction. For example, the areas of the five second openings 442e are configured such that the second opening 442e disposed closer to the center C of the semiconductor structure 120 has a smaller area. The top view shapes of the five second openings 442e are substantially symmetrical with the five second openings 442d with respect to a plane passing through the center C and parallel to the XZ plane.

The number of, the positions of, and the areas of the second openings disposed in the insulating film are not limited to those described above. In addition, one second opening may be disposed so as not to overlap with the plurality of second conductive members.

Fifth Embodiment

Figure 13:
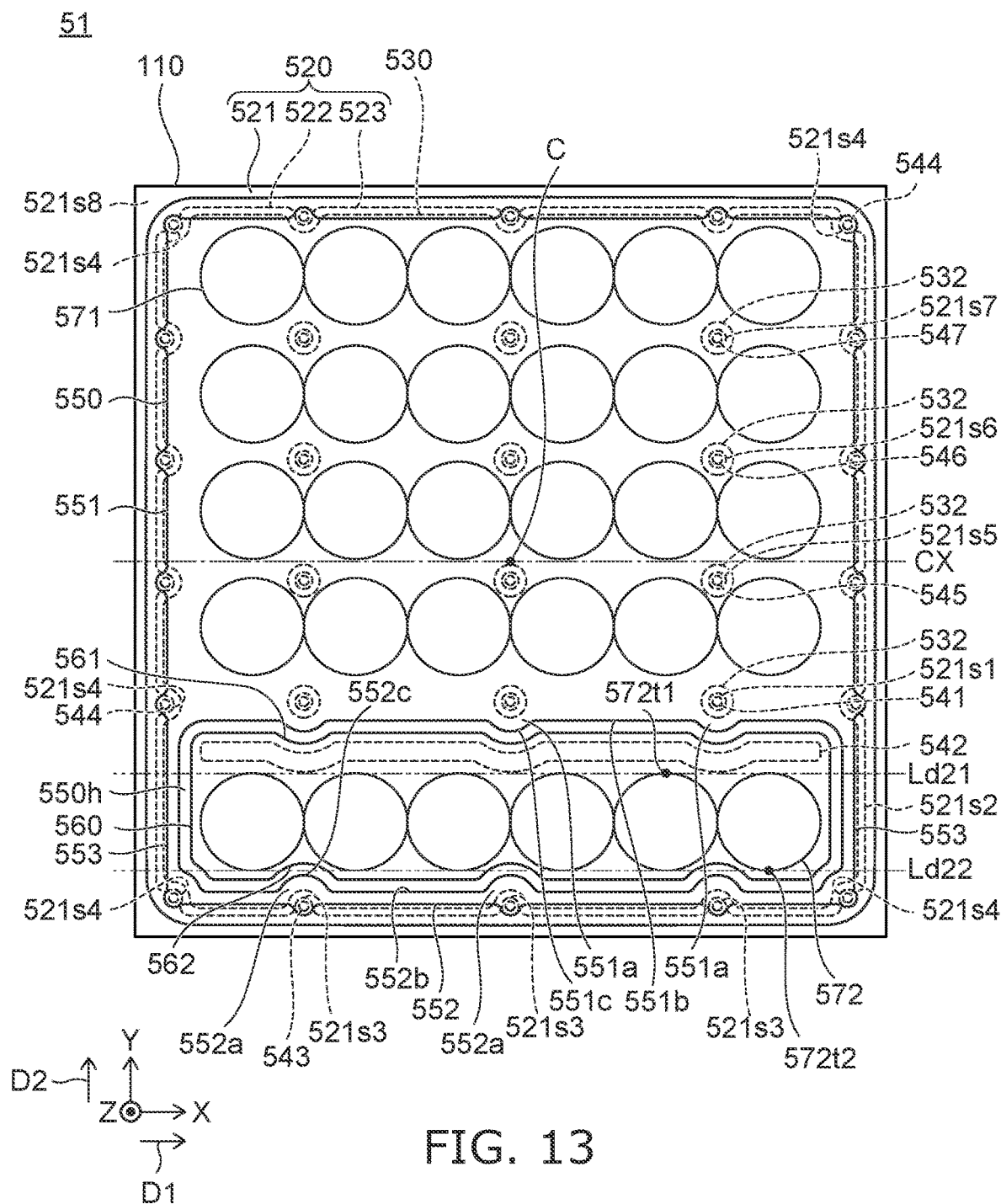
FIG. 13 illustrates a top view of a light-emitting element according to a fifth embodiment.

FIG. 13 illustrates a top view of a light-emitting element 51 according to a fifth embodiment.

Figure 14:
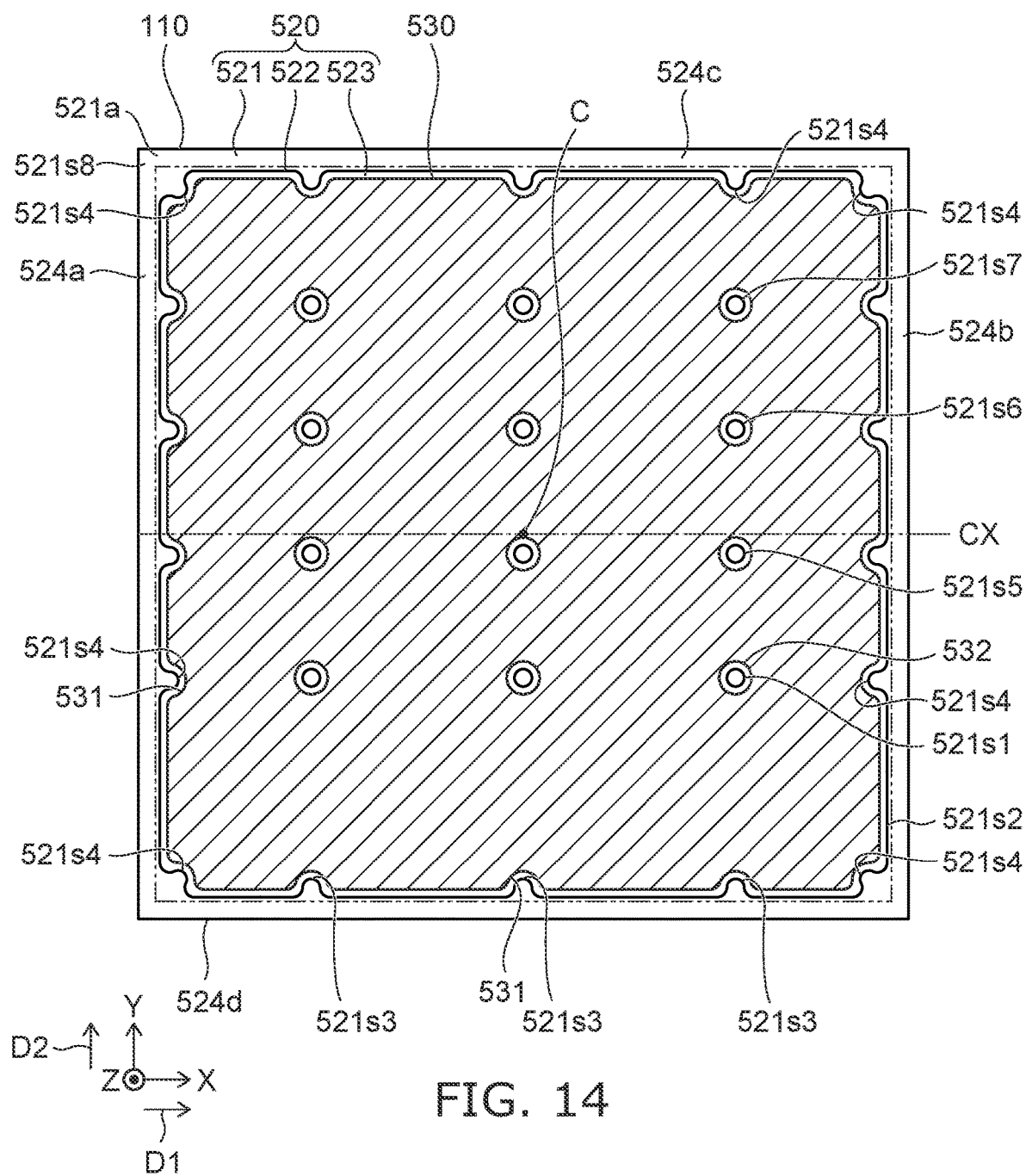
FIG. 14 illustrates a top view of the light-emitting element according to the fifth embodiment.

FIG. 14 illustrates a top view of the support substrate 110, a semiconductor structure 520, and a third electrode 530 of the light-emitting element 51 according to the present embodiment.

It is noted that, in FIG. 14, hatching is applied to the region where the third electrode 530 is disposed, for the purpose of facilitating understanding.

The light-emitting element 51 according to the present embodiment differs from the light-emitting element 11 according to the first embodiment, in that, in the top view, a second electrode 560 is not positioned on the center of the semiconductor structure 520 in the second direction D2. It is noted that the shape of the boundary between an outer peripheral region 521s8 and a second region 521s2 of the first semiconductor layer 521 and the shape of the outer edge of the first electrode 550 are configured in a manner similar to those in the third embodiment, and hence, explanation thereof will not be repeated.

An upper surface 521a of the first semiconductor layer 521 includes a plurality of first regions 521s1, the second region 521s2, a plurality of third regions 521s3, a plurality of fourth regions 521s4, a plurality of fifth regions 521s5, a plurality of sixth regions 521s6, a plurality of seventh regions 521s7, and the outer peripheral region 521s8.

The second region 521s2 is a region of the upper surface 521a that is to be covered by the active layer 522 and the second semiconductor layer 523. The plurality of first regions 521s1, the plurality of fifth regions 521s5, the plurality of sixth regions 521s6, and the plurality of seventh regions 521s7 are regions that are positioned inside the outer edge of the second region 521s2 of the upper surface 521a and are not covered with the active layer 522 and the second semiconductor layer 523.

In the top view, the plurality of first regions 521s1 are positioned on the −Y side of the straight line CX in the top view. The plurality of first regions 521s1 are lined up at substantially equal intervals in the first direction D1. The number of the first regions 521s1 is three. In the top view, the plurality of fifth regions 521s5 are positioned on the +Y side of the plurality of first regions 521s1 and on the −Y side of the straight line CX. The plurality of fifth regions 521s5 are lined up at substantially equal intervals in the first direction D1. The number of the fifth regions 521s5 is three. Each of the fifth regions 521s5 is aligned with the corresponding one of the first regions 521s1 in the second direction D2.

In the top view, the plurality of sixth regions 521s6 are positioned on the +Y side of the plurality of fifth regions 521s5 and the straight line CX. The plurality of sixth regions 521s6 are lined up at substantially equal intervals in the first direction D1. The number of the sixth regions 521s6 is three. Each of the sixth regions 521s6 is aligned with the corresponding one of the fifth regions 521s5 in the second direction D2. The plurality of seventh regions 521s7 are positioned on the +Y side of the plurality of sixth regions 521s6. The plurality of seventh regions 521s7 are lined up at substantially equal intervals in the first direction D1. The number of the seventh regions 521s7 is three. Each of the seventh regions 521s7 is aligned with the corresponding one of the sixth regions 521s6 in the second direction D2.

The plurality of third regions 521s3, the plurality of fourth regions 521s4, and the outer peripheral region 521s8 are regions that are positioned outside the second region 521s2 of the upper surface 521a and are not covered with the active layer 522 and the second semiconductor layer 523.

The outer peripheral region 521s8 is a region having a frame shape and including the outer edge of the upper surface of the first semiconductor layer 521. The shape of the outer edge of the outer peripheral region 521s8 is substantially rectangular as with the shape of the outer edge of the upper surface 521a. The shape of the inner edge of the outer peripheral region 521s8 is, for example, similar to the shape of the outer edge of the upper surface 521a and is substantially rectangular. Specifically, the outer peripheral region 521s8 includes a first stretching portion 524a extending in the Y direction and positioned on the most −X side, a second stretching portion 524b extending in the Y direction and positioned on the most +X side, a third stretching portion 524c extending in the X direction and positioned on the most +Y side, and a fourth stretching portion 524d extending in the X direction and positioned on the most −Y side. The third stretching portion 524c is positioned between an end portion, in the +Y direction, of the first stretching portion 524a and an end portion, in the +Y direction, of the second stretching portion 524b. An end portion, in the −X direction, of the third stretching portion 524c is connected to the end portion, in the +Y direction, of the first stretching portion 524a. An end portion, in the +X direction, of the third stretching portion 524c is connected to the end portion, in the +Y direction, of the second stretching portion 524b. The fourth stretching portion 524d is positioned between an end portion, in the −Y direction, of the first stretching portion 524a and an end portion, in the −Y direction, of the second stretching portion 524b. An end portion, in the −X direction, of the fourth stretching portion 524d is connected to the end portion, in the −Y direction, of the first stretching portion 524a. An end portion, in the +X direction, of the fourth stretching portion 524d is connected to the end portion, in the −Y direction, of the second stretching portion 524b.

Three third regions 521s3 extend inward from the fourth stretching portion 524d. In addition, four fourth regions 521s4 extend inward from the first stretching portion 524a. Furthermore, four fourth regions 521s4 extend inward from the second stretching portion 524b. In addition, three fourth regions 521s4 extend inward from the third stretching portion 524c. Furthermore, four fourth regions 521s4 extend inward from the corresponding four corner portions of the outer peripheral region 521s8. Thus, the number of the fourth regions 521s4 is 15.

The third electrode 530 includes recessed portions 531 where the plurality of third regions 521s3 and the plurality of fourth regions 521s4 are individually exposed. In addition, the third electrode 530 includes a plurality of openings 532 where the plurality of first regions 521s1, the plurality of fifth regions 521s5, the plurality of sixth regions 521s6, and the plurality of seventh regions 521s7 are individually exposed.

As illustrated in FIG. 13, the insulating film 540 includes a plurality of first openings 541, one second opening 542, a plurality of third openings 543, a plurality of fourth openings 544, a plurality of fifth openings 545, a plurality of sixth openings 546, and a plurality of seventh openings 547.

Each of the first regions 521s1 is exposed at the corresponding one of the first openings 541. Each of the third regions 521s3 is exposed at the corresponding one of the third openings 543. Each of the fourth regions 521s4 is exposed at the corresponding one of the fourth openings 544. Each of the fifth regions 521s5 is exposed at the corresponding one of the fifth openings 545. Each of the sixth regions 521s6 is exposed at the corresponding one of the sixth openings 546. Each of the seventh regions 521s7 is exposed at the corresponding one of the seventh openings 547.

The second opening 542 is disposed in a portion that overlaps with the second semiconductor layer 523 in the top view, and a portion of the third electrode 530 is exposed at the second opening 542. Specifically, in the top view, the second opening 542 does not overlap with the plurality of second conductive members 572 and is positioned between the plurality of second conductive members 572 and the plurality of first regions 521s1. However, the position of the second opening is not limited to that described above. For example, the second opening may overlap with the plurality of second conductive members 572. In addition, the number of the second openings may be two or more.

The first electrode 550 covers the plurality of first openings 541, the plurality of third openings 543, the plurality of fourth openings 544, the plurality of fifth openings 545, the plurality of sixth openings 546, and the plurality of seventh openings 547. The first electrode 550 is in contact with the plurality of first regions 521s1 through the plurality of first openings 541. In addition, the first electrode 550 is in contact with the plurality of third regions 521s3 through the plurality of third openings 543. Furthermore, the first electrode 550 is in contact with the plurality of fourth regions 521s4 through the plurality of fourth openings 544. In addition, the first electrode 550 is in contact with the plurality of fifth regions 521s5 through the plurality of fifth openings 545. Furthermore, the first electrode 550 is in contact with the plurality of sixth regions 521s6 through the plurality of sixth openings 546. In addition, the first electrode 550 is in contact with the plurality of seventh regions 521s7 through the plurality of seventh openings 547.

The first electrode 550 includes a through-hole 550h. The through-hole 550h is positioned between the plurality of first regions 521s1 and the plurality of third regions 521s3 and on the second opening 542 of the insulating film 540, in the top view. The second electrode 560 is disposed in the through-hole 550h. The second electrode 560 is in contact with the third electrode 530 through the second opening 542.

The first electrode 550 includes a first electrode region 551 positioned on the +Y side of the through-hole 550h, a second electrode region 552 positioned on the −Y side of the through-hole 550h, and two third electrode regions 553 each adjacent to the through-hole 550h in the X direction. The through-hole 550h is positioned between the two third electrode regions 553.

The first electrode region 551 covers the plurality of first regions 521s1 and 13 fourth regions 521s4 in which a fourth region 521s4 positioned on the most −Y side and on the most −X side and a fourth region 521s4 positioned on the most −Y side and on the most +X side are excluded from 15 fourth regions 521s4, and also covers the plurality of fifth regions 521s5, the plurality of sixth regions 521s6, and the plurality of seventh regions 521s7. The first electrode region 551 is adjacent to the second electrode 560 in the second direction D2.

The first electrode region 551 includes a plurality of first portions 551a that cover the plurality of corresponding first regions 521s1, and a second portion 551b positioned between adjacent first portions 551a. The first portion 551a includes a first extending portion 551c extending from the first electrode region 551 in a direction toward the second electrode 560, that is in the −Y direction, further than the second portion 551b.

The second electrode region 552 covers the plurality of third regions 521s3, a fourth region 521s4 of the plurality of fourth regions 521s4 that is positioned on the most −Y side and on the most −X side, and a fourth region 521s4 of the plurality of fourth regions 521s4 that is positioned on the most −Y side and on the most +X side. The second electrode 560 is positioned between the first electrode region 551 and the second electrode region 552.

The second electrode region 552 includes a plurality of third portions 552a that cover the plurality of corresponding third regions 521s3, and a fourth portion 552b positioned between adjacent third portions 552a. The third portion 552a includes a second extending portion 552c extending from the second electrode region 552 in a direction toward the second electrode 560, that is in the +Y direction, further than the fourth portion 552b.

In the top view, the second electrode 560 includes a plurality of first recessed portions 561 corresponding to the shapes of the plurality of first extending portions 551c, and a plurality of second recessed portions 562 corresponding to the shapes of the plurality of second extending portions 552c.

In the present embodiment, the plurality of first conductive members 571 are disposed on the first electrode region 551. The number of the first conductive member 571 is 24. The 24 first conductive members 571 are disposed in a matrix form so that six first conductive members 571 are disposed in the X direction and four first conductive members 571 are disposed in the Y direction.

The plurality of second conductive members 572 are aligned in the first direction D1. Each of the second conductive member 572 includes a first end portion 572t1 closest to the first electrode region 551 in the second direction D2, and a second end portion 572t2 closest to the second electrode region 552 in the second direction D2. In the top view, the plurality of first extending portions 551c are positioned proximate to the second portion 551b relative to a first straight line Ld21, that is, on the +Y side of the first straight line Ld21. The first straight line Ld21 extends in the first direction D1 and passing through a first end portion 572t1 closest to the first electrode region 551 of the first end portions 572t1 of the plurality of second conductive members 572. In addition, in the top view, the plurality of second extending portions 552c are positioned proximate to the fourth portion 552b relative to a second straight line Ld22, that is, on the −Y side of the second straight line Ld22. The second straight line Ld22 extends in the first direction D1 and passing through a second end portion 572t2 closest to the second electrode region 552 of the second end portions 572t2 of the plurality of second conductive members 572.

In the present embodiment, in the top view, the plurality of first recessed portions 561 of the second electrode 560 are positioned proximate to the second portion 551b relative to the first straight line Ld21, that is, on the +Y side of the first straight line Ld21. In the present embodiment, in the top view, the plurality of second recessed portions 562 are positioned proximate to the fourth portion 552b relative to the second straight line Ld22, that is, on the −Y side of the second straight line Ld22. However, the positional relationship between the plurality of first recessed portions and the first straight line and the positional relationship between the plurality of second recessed portions and the second straight line are not limited to those described above.

Figure 15:
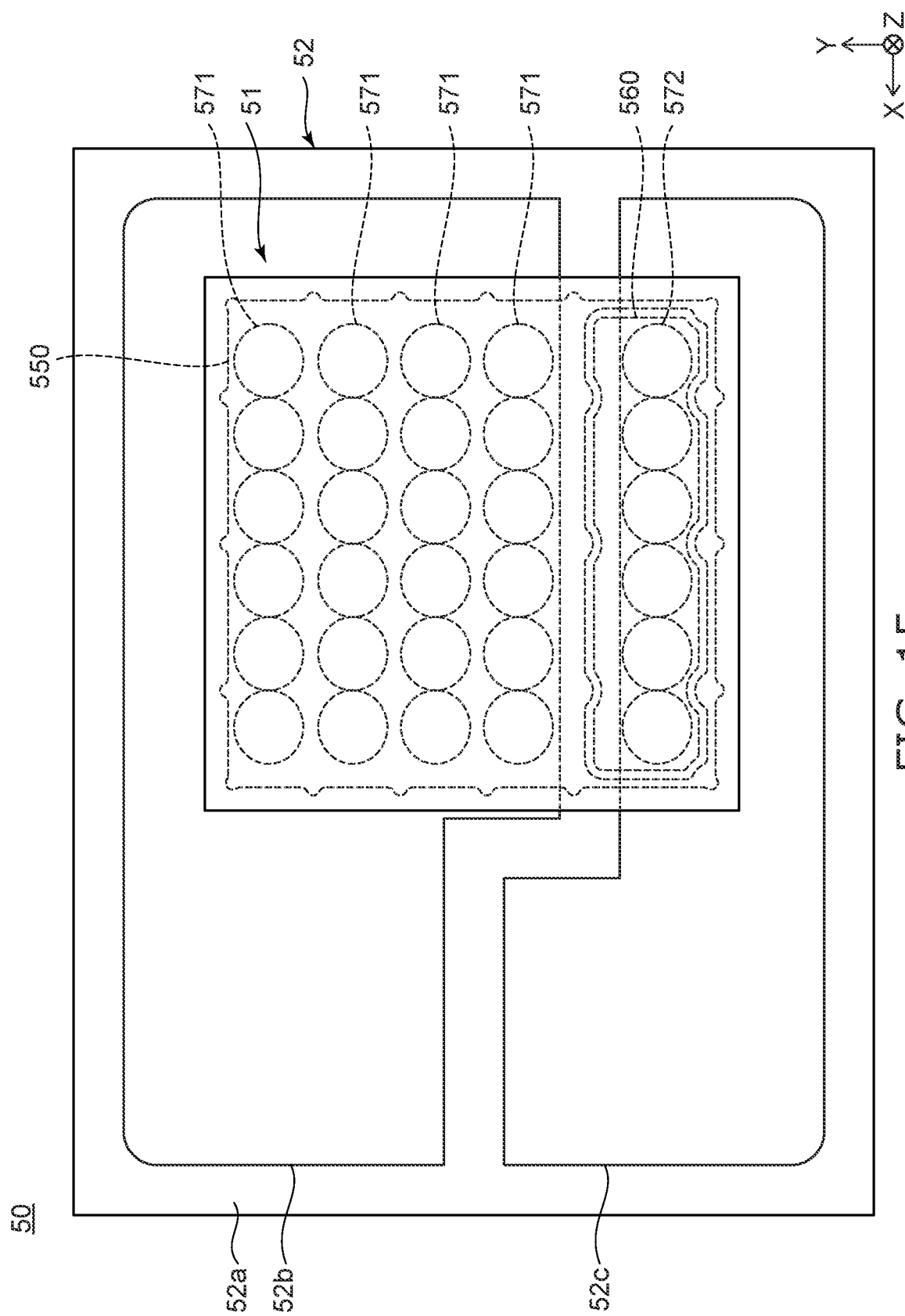
FIG. 15 illustrates a top view of some components of a light-emitting device according to the fifth embodiment.

Next, a light-emitting device 50 according to the fifth embodiment will be described. FIG. 15 illustrates a top view of a light-emitting element 51 and a substrate 52 of the light-emitting device 50 according to the present embodiment.

The light-emitting device 50 includes the light-emitting element 51 and the substrate 52. Flip chip bonding is used to mount the light-emitting element 51 on the substrate 52. The substrate 52 includes an insulating member 52a, a first wiring line 52b, and a second wiring line 52c. The first wiring line 52b is brought into contact with the plurality of first conductive members 571 to be electrically connected to the plurality of first conductive members 571. The second wiring line 52c is brought into contact with the plurality of second conductive members 572 to be electrically connected to the plurality of second conductive members 572. The first wiring line 52b is disposed so as to be opposed to the first electrode region 551 of the first electrode 550. The second wiring line 52c is disposed so as to be opposed to the second electrode 560.

In this manner, the second electrode 560 may not be positioned on the center of the semiconductor structure 520 in the second direction D2. According to the present embodiment, it is possible to reduce the brightness unevenness of the light-emitting element 51, and at the same time, it is possible to provide the light-emitting element 51 that can be easily mounted.

The plurality of embodiments have been described by using an example in which the first electrode includes the first electrode region and the second electrode region. That is, description has been made by using an example in which two electrode regions each having extending portions are included in the first electrode. In an alternative embodiment, the number of the electrode regions having extending portions in the first electrode may be one.

Each of the configurations in the plurality of embodiments described above can be combined as appropriate in a range in which they do not contradict each other.

What is claimed is:
1. A light-emitting element comprising:
a semiconductor structure comprising:
   a first semiconductor layer of a first conductive type including, on an upper surface of the first semiconductor layer, a plurality of first regions and a second region surrounding each of the plurality of first regions;
   an active layer disposed selectively on the second region of the first semiconductor layer; and
   a second semiconductor layer of a second conductive type disposed on the active layer;
an insulating film disposed on the semiconductor structure and including:
   a plurality of first openings above the plurality of first regions, respectively; and
   a second opening above a region of the second semiconductor layer;
a first electrode disposed on the insulating film and electrically connected to the plurality of first regions through the plurality of first openings;
a second electrode disposed above the region of the second semiconductor layer, spaced apart from the first electrode, and electrically connected to the second semiconductor layer through the second opening;
a plurality of first conductive members disposed on the first electrode; and
a plurality of second conductive members disposed on the second electrode, wherein
the plurality of first regions are aligned in a first direction on the upper surface of the first semiconductor layer,
the first electrode comprises a first electrode region covering the plurality of first regions adjacent to the second electrode in a second direction perpendicular to the first direction,
the first electrode region includes:
   a plurality of first portions covering the plurality of first regions, respectively; and
   a second portion positioned between two adjacent first portions of the plurality of first portions,
the plurality of first portions comprises a plurality of first extending portion extending in the second direction toward the second electrode with respect to the second portion,
the second electrode comprises a plurality of first recessed portions corresponding to the plurality of the first extending portions, respectively,
the plurality of second conductive members are aligned in the first direction and include a plurality of first end portions, respectively, each of which is closest to the first electrode region in the second direction, the plurality of the first extending portions are positioned closer to the second portion in the second direction than a first straight line that extends in the first direction and passes through one of the first end portions that is closest to the first electrode region, and the plurality of second conductive members are positioned inside the second opening in a top view.

2. The light-emitting element according to claim 1, wherein, the plurality of first recessed portions are positioned closer to the first electrode region in the second region than the first straight line.

3. The light-emitting element according to claim 1, wherein a portion of an outer edge of the second opening positioned between the plurality of second conductive members and the first electrode region is positioned closer to the first electrode region in the second direction than the first straight line in the top view.

4. The light-emitting element according to claim 1, wherein, the second electrode is positioned on a center of the semiconductor structure in the second direction.

5. The light-emitting element according to claim 1, wherein the first semiconductor layer further comprises a plurality of third regions that is aligned in the first direction and above which the active layer and the second semiconductor layer are not disposed, the insulating film further comprises a plurality of third openings above the plurality of third regions, respectively, the first electrode is electrically connected to the plurality of third regions through the plurality of corresponding third openings, the second electrode is positioned between the plurality of first regions and the plurality of third regions in the second direction, the first electrode further includes a second electrode region covering the plurality of third regions adjacent to the second electrode in the second direction, the second electrode region comprises a plurality of third portions covering the plurality of third regions, respectively, and a fourth portion positioned between two adjacent third portions of the plurality of third portions, the plurality of third portions comprises a plurality of second extending portion extending from the second electrode region in the second direction toward the second electrode with respect to the fourth portion, the second electrode comprises a plurality of second recessed portions corresponding to the plurality of the second extending portions, respectively, the plurality of second conductive members include a plurality of second end portions, respectively, each of which is closest to the second electrode region in the second direction, and the plurality of the second extending portions are positioned closer to the fourth portion in the second direction than a second straight line that extends in the first direction and passes through one of the second end portion closest to the second electrode region.

6. The light-emitting element according to claim 5, wherein the plurality of second recessed portions of the second electrode are positioned closer to the second electrode region in the second direction than the second straight line.

7. The light-emitting element according to claim 1, wherein the upper surface of the first semiconductor layer further comprises:
  an outer peripheral region above which the active layer and the second semiconductor layer are not disposed and that is positioned outside an outer periphery of the second semiconductor layer in a top view; and
  a plurality of fourth regions each extending inward from the outer peripheral region, the insulating film comprises a plurality of fourth openings above the plurality of fourth regions, respectively, and the first electrode is electrically connected to the plurality of fourth regions through the plurality of fourth openings.

8. The light-emitting element according to claim 7, wherein an outer edge of the first electrode is positioned outside the plurality of fourth openings in a top view, and a portion of an outer edge of each of the plurality of fourth openings adjacent to the outer edge of the first electrode extends parallel to the outer edge of the first electrode in a top view.

9. The light-emitting element according to claim 7, wherein an outer peripheral portion of the first electrode includes:
  a plurality of fifth portions covering the plurality of fourth regions, respectively; and
  a sixth portion positioned between two adjacent fifth portions of the plurality of fifth portions, and the sixth portion is positioned inside the outer peripheral region of the first semiconductor layer in a top view.

10. A light-emitting device comprising:

the light-emitting element according to claim 1; and a substrate comprising:
  a first wiring line electrically connected to the plurality of first conductive members; and
  a second wiring line spaced apart from the first wiring line and electrically connected to the plurality of second conductive members.

* * * * *